US010340279B2

(12) United States Patent
Shiimoto

(10) Patent No.: US 10,340,279 B2
(45) Date of Patent: Jul. 2, 2019

(54) SEMICONDUCTOR DEVICE AND METHOD OF MANUFACTURING THE SAME

(71) Applicant: SONY SEMICONDUCTOR SOLUTIONS CORPORATION, Kanagawa (JP)

(72) Inventor: Tsunenori Shiimoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/574,771

(22) PCT Filed: May 18, 2016

(86) PCT No.: PCT/JP2016/002430
§ 371 (c)(1),
(2) Date: Nov. 16, 2017

(87) PCT Pub. No.: WO2016/189831
PCT Pub. Date: Dec. 1, 2016

(65) Prior Publication Data
US 2018/0102371 A1 Apr. 12, 2018

(30) Foreign Application Priority Data
May 27, 2015 (JP) .................................. 2015-107672

(51) Int. Cl.
*H01L 27/082* (2006.01)
*H01L 27/112* (2006.01)
(Continued)

(52) U.S. Cl.
CPC ...... *H01L 27/11206* (2013.01); *H01L 21/326* (2013.01); *H01L 23/5252* (2013.01);
(Continued)

(58) Field of Classification Search
None
See application file for complete search history.

(56) References Cited

U.S. PATENT DOCUMENTS 8,970,040 B1    3/2015   Chen
2007/0045708 A1* 3/2007  Lung .................... H01L 27/101
                                                    257/314
(Continued)

FOREIGN PATENT DOCUMENTS

JP    2008-181978    8/2008
JP    2013-004690    1/2013

OTHER PUBLICATIONS

International Search Report and Written Opinion prepared by the European Patent Office dated Jul. 25, 2016, for International Application No. PCT/JP2016/002430.

*Primary Examiner* — Kevin M Picardat
(74) *Attorney, Agent, or Firm* — Sheridan Ross P.C.

(57) ABSTRACT

Semiconductors and methods of manufacturing semiconductors are provided. A semiconductor can include a plurality of insulating layers, and a plurality of conductive layers, with the insulating layers and the conductive layers alternately stacked. A plurality of through electrodes penetrate the conductive layers. At least some the through electrodes are electrically connected to one of the conductive layers. In addition, different conductive layers are connected to different through electrodes. A method of forming a semiconductor structure includes providing a plurality of antifuses, wherein each of the through electrodes is separated from each of the conductive layers by an antifuse. The method further includes supplying at least a first voltage to a first through electrode while applying less than a second voltage to the other electrodes, wherein the first voltage is greater than the second voltage.

20 Claims, 29 Drawing Sheets

(51) Int. Cl.
*H01L 27/11524* (2017.01)
*H01L 27/11548* (2017.01)
*H01L 27/11556* (2017.01)
*H01L 27/1157* (2017.01)
*H01L 27/11575* (2017.01)
*H01L 27/11582* (2017.01)
*H01L 21/326* (2006.01)
*H01L 23/525* (2006.01)
*G11C 16/04* (2006.01)

(52) U.S. Cl.
CPC .... *H01L 27/1157* (2013.01); *H01L 27/11524* (2013.01); *H01L 27/11548* (2013.01); *H01L 27/11556* (2013.01); *H01L 27/11575* (2013.01); *H01L 27/11582* (2013.01); *G11C 16/0483* (2013.01)

(56) References Cited

U.S. PATENT DOCUMENTS

| | | | |
|---|---|---|---|
| 2012/0181701 A1* | 7/2012 | Chen | H01L 23/50 257/774 |
| 2013/0095654 A1 | 4/2013 | Kwon et al. | |
| 2015/0076668 A1* | 3/2015 | Shih | H01L 21/76883 257/623 |
| 2015/0145012 A1* | 5/2015 | Chen | H01L 27/11578 257/314 |

* cited by examiner (A) SWITCHING SIGNAL SS (B) PRECHARGE SIGNAL SP (C) VOLTAGE Vo
(VOLTAGE OF THROUGH ELECTRODE EL2)

$Qo = 47/16 \times Cp \times Vw$
$Vo = Vw$
$Vo - V4 = 1/2 \times Vw$
$Vo - V3 = 13/16 \times Vw$
$Vo - V2 = 13/16 \times Vw$
$Vo - V1 = 13/16 \times Vw$
$V4 = 1/2 \times Vw$
$V3 = 3/16 \times Vw$
$V2 = 3/16 \times Vw$
$V1 = 3/16 \times Vw$ $Qo = 47/16 \times Cp \times Vw$
$Vo = 5/12 \times Vw$
$Vo - V4 = -1/12 \times Vw$
$Vo - V3 = 29/96 \times Vw$
$Vo - V2 = 0$
$Vo - V1 = 29/96 \times Vw$
$V4 = 1/2 \times Vw$
$V3 = 11/96 \times Vw$
$V2 = 5/12 \times Vw$
$V1 = 11/96 \times Vw$ $Q_o = 35/16 \times C_p \times V_w$
$V_o = V_w$
$V_o - V_4 = 1/2 \times V_w$
$V_o - V_3 = 11/16 \times V_w$
$V_o - V_2 = 1/2 \times V_w$
$V_o - V_1 = 1/2 \times V_w$
$V_4 = 1/2 \times V_w$
$V_3 = 5/16 \times V_w$
$V_2 = 1/2 \times V_w$
$V_1 = 1/2 \times V_w$ $Q_o = 35/16 \times C_p \times V_w$
$V_o = 83/160 \times V_w$
$V_o - V_4 = 3/160 \times V_w$
$V_o - V_3 = 0$
$V_o - V_2 = 3/160 \times V_w$
$V_o - V_1 = 3/160 \times V_w$
$V_4 = 1/2 \times V_w$
$V_3 = 83/160 \times V_w$
$V_2 = 1/2 \times V_w$
$V_1 = 1/2 \times V_w$ $$Q_o = \frac{(N+1)(M-1)}{2M} \times C_p \times V_w$$

$$V_o = V_w$$

$$V_o - V_3 = \frac{2M-N-1}{2M} \times V_w \equiv V_a$$

$$V_o - V(n) = \frac{1}{2} \times V_w \ (n \neq 3)$$

$$V_3 = \frac{N+1}{2M} \times V_w$$

$$V(n) = \frac{1}{2} \times V_w \ (n \neq 3)$$

$$Q_c = \frac{(N-1)(M+1)(M-N-1)}{2M} \times C_p \times V_w$$

$$Q_o = \frac{(N+1)(M-1)}{2M} \times C_p \times V_w$$

$$Q_c = \frac{(N-1)(M+1)(M-N-1)}{2M} \times C_p \times V_w$$

$$V_o = V_3 = \frac{2(N-1)(M+1)(M-N-1) + (N+1)(M-1)(M-N+2)}{2M(M+N)(M-N)} \times V_w \equiv V_b$$

SEMICONDUCTOR DEVICE AND METHOD OF MANUFACTURING THE SAME

CROSS REFERENCE TO RELATED APPLICATIONS

This application is a national stage application under 35 U.S.C. 371 and claims the benefit of PCT Application No. PCT/JP2016/002430 having an international filing date of 18 May 2016, which designated the United States, which PCT application claimed the benefit of Japanese Priority Patent Application No. JP 2015-107672 filed May 27, 2015, the entire contents of which are incorporated herein by reference.

TECHNICAL FIELD

The disclosure relates to a semiconductor device including a plurality of conductive layers and a plurality of insulating layers that are alternately stacked, and a method of manufacturing such a semiconductor device.

BACKGROUND ART

In recent years, three-dimensional semiconductor devices have been proposed to enhance integration of circuits. For example, Japanese Unexamined Patent Application Publication No. 2013-004690 (PTL 1) discloses a NAND flash memory. Moreover, for example, Japanese Unexamined Patent Application Publication No. 2008-181978 (PTL 2) discloses a storage device using a resistive switching element. In these three-dimensional semiconductor devices, a plurality of conductive layers and a plurality of insulating layers are alternately stacked.

CITATION LIST

Patent Literature

PTL 1: Japanese Unexamined Patent Application Publication No. 2013-004690
PTL 2: Japanese Unexamined Patent Application Publication No. 2008-181978

SUMMARY

In semiconductor devices, a small area is generally desirable, and further reduction in the area of the semiconductor device is expected.

It is desirable to provide a semiconductor device and a method of manufacturing a semiconductor device that make it possible to reduce the area of the semiconductor device.

According to a semiconductor device of embodiments of the disclosure, a plurality of through electrodes are provided in a second region, and antifuses are each provided between corresponding ones of the through electrodes and corresponding one of the conductive layers. This makes it possible to reduce the area of the semiconductor device.

According to the method of manufacturing the semiconductor device of embodiments of the disclosure, a first through electrode is selected from a plurality of through electrodes, a first voltage is applied to one or more of the through electrodes excluding the first through electrode, and a second voltage is applied to the first through electrode. This makes it possible to reduce area of the semiconductor device.

A semiconductor device of at least one aspect of the present disclosure includes a plurality of insulating layers, and a plurality of conductive layers. The insulating layers and the conductive layers are alternately stacked. A plurality of through electrodes penetrate the conductive layers. At least some of the through electrodes are electrically connected to one of the connected layers, and different conductive layers are connected to different through electrodes.

A method of at least one aspect of the present disclosure includes providing a plurality of conductive layers, and providing a plurality of insulating layers, wherein the conductive layers are alternately stacked with the insulating layers. The method further includes providing a plurality of through electrodes, wherein the through electrodes penetrate the plurality of conductive layers and the plurality of insulating layers. A plurality of antifuses are provided, with each through electrode separated from each conductive layer by an antifuse. At least a first voltage is applied to a first through electrode included in the plurality of through electrodes, while less than a second voltage is applied to the other through electrodes included in the plurality of through electrodes, wherein the first voltage is greater than the second voltage.

An electronic apparatus of at least one aspect of the present technology includes a memory cell array that includes a plurality of insulating layers, and a plurality of conductive layers, wherein each of the insulating layers and the conductive layers are alternately stacked. The memory cell array further includes a plurality of through electrodes, wherein each of the through electrodes penetrates the conductive layers, and wherein at least some of the through electrodes are electrically connected to one of the conductive layers. A row decoder is electrically connected to the through electrodes in a contact section of the memory cell array.

Note that effects described here are non-limiting. Effects achieved by the technology may be one or more of the effects described in the disclosure.

It is to be understood that both the foregoing general description and the following detailed description are exemplary, and are provided to provide further explanation of the technology as claimed.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

DESCRIPTION OF EMBODIMENTS

Some embodiments of the disclosure are described in detail below with reference to drawings.

Configuration Example

Figure 1:
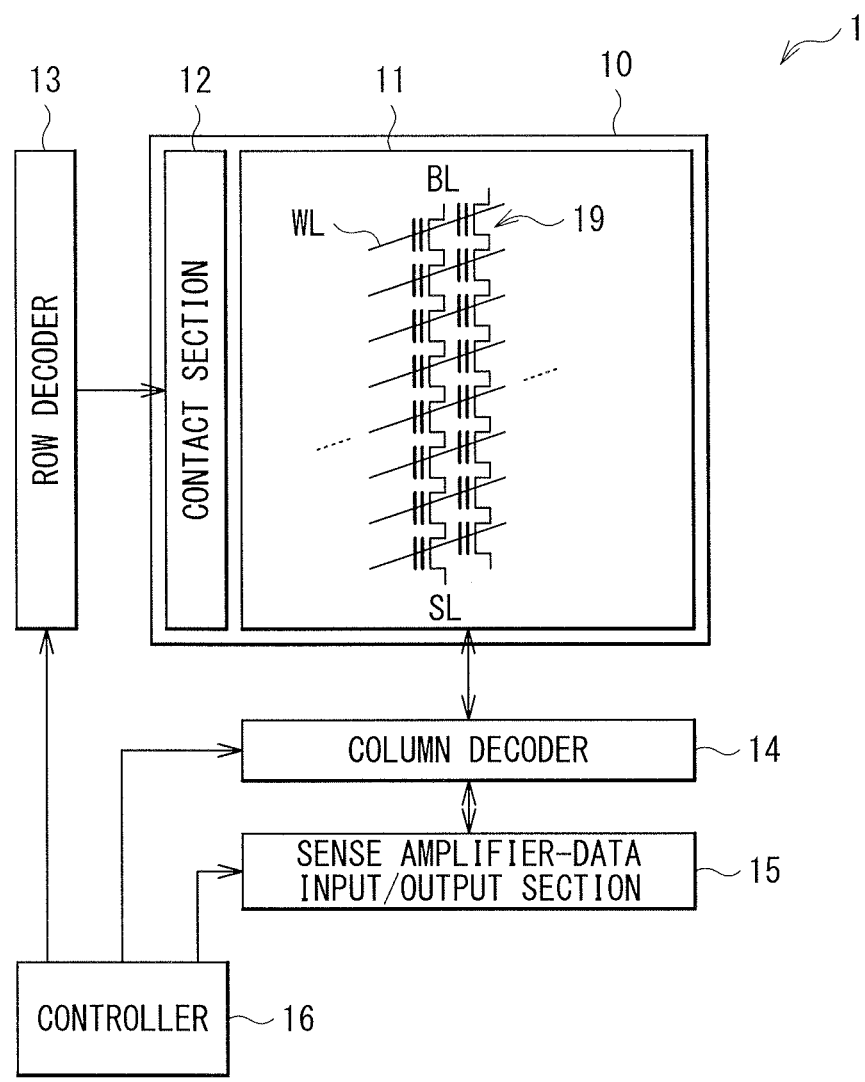
FIG. 1 is a block diagram of a configuration example of a storage device to which a semiconductor device according to an embodiment of the disclosure is applied.

FIG. 1 illustrates a configuration example of a storage device (a storage device 1) to which a semiconductor device according to an embodiment is applied. The storage device 1 may be a NAND flash memory. Note that a method of manufacturing a semiconductor device according to an embodiment of the disclosure may be embodied by this embodiment, and description thereof is therefore given together. The storage device 1 may include a memory cell array 10, a row decoder 13, a column decoder 14, a sense amplifier-data input/output section 15, and a controller 16.

The memory cell array 10 may include an array section 11 and a contact section 12. The array section 11 may include a plurality of memory elements 19, a plurality of word lines WL, a plurality of source lines SL, and a plurality of bit lines BL. The plurality of word lines WL are coupled to the row decoder 13 through the contact section 12. The plurality of source lines SL and the plurality of bit lines BL are coupled to the column decoder 14. The contact section 12 is adapted to function as a contact for coupling of the row decoder 13 to the word lines WL of the array section 11.

Figure 2:
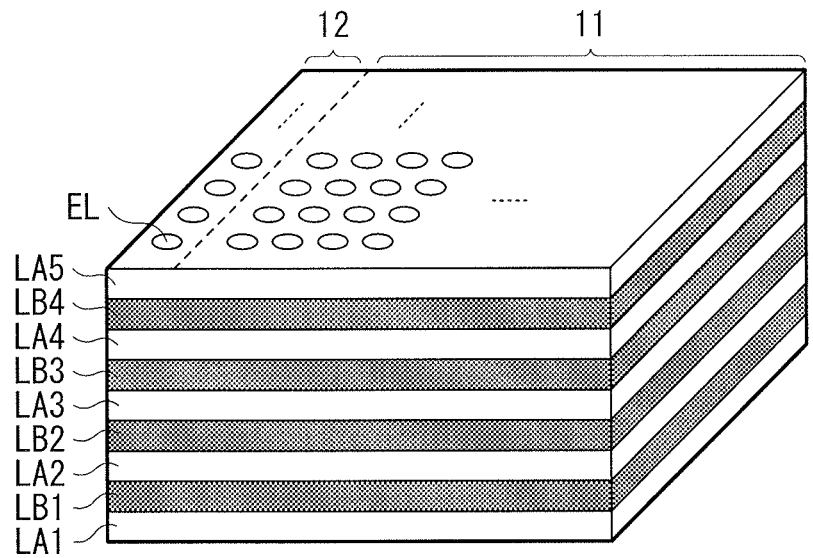
FIG. 2 is an explanatory diagram of a configuration example of a memory cell array illustrated in FIG. 1.

FIG. 2 illustrates a configuration example of the memory cell array 10. As illustrated in FIG. 2, the memory cell array 10 may include insulating layers LA, conductive layers LB, and through electrodes EL. The insulating layers LA and the conductive layers LB are alternately stacked. In this example, five insulating layers LA (LA1 to LA5) and four conductive layers LB (LB1 to LB4) are alternately stacked in order of LA1, LB1, LA2, LB2, LA3, LB3, LA4, LB4, and LA5. Note that, in this example, the number of conductive layers LB is four, but the number of conductive layers LB is not limited thereto, and may be equal to or smaller than three or equal to or greater than five. The conductive layers LB correspond to the word lines WL illustrated in FIG. 1.

The through electrodes EL are formed so as to penetrate the insulating layers LA and the conductive layers LB that are stacked. The through electrodes EL may be made of a conductive material. For example, tungsten, copper, aluminum, polysilicon, titanium nitride, or any other conductive material may be used.

Figure 3:
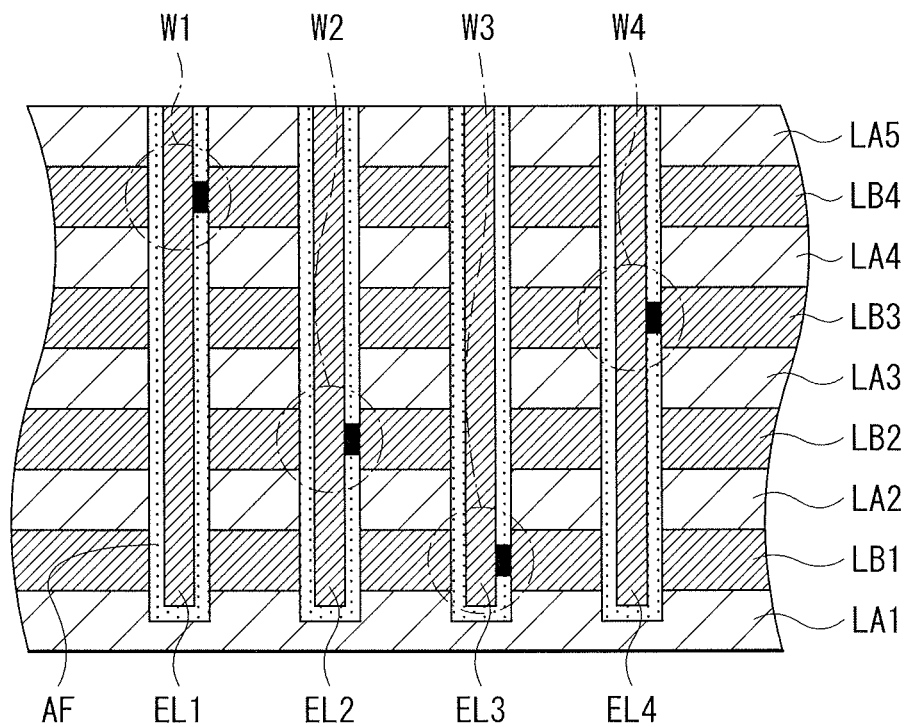
FIG. 3 is a sectional view of a configuration example of a contact section illustrated in FIG. 2.

FIG. 3 illustrates a configuration example of the contact section 12. The contact section 12 may include antifuse films AF. The respective antifuse films AF are formed so as to cover a plurality of respective through electrodes EL (four through electrodes EL1 to EL4 in this example). The antifuse films AF are each adapted to switch a resistance state thereof from a high resistance state to a low resistance state by application of a stress voltage. The antifuse films AF may be made of, for example, a material causing dielectric breakdown by application of the stress voltage. Specific but non-limiting examples of the antifuse films AF may include a film made of silicon oxide, a film made of silicon nitride, a film made of hafnium oxide, a film made of titanium oxide, a film made of tantalum oxide, and a composite film of two or more of them. Moreover, a composite film of one or more of the foregoing films and a thin conductive film may be used. As another example, a material whose state is varied by application of the stress voltage to vary a resistance state thereof may be used for the antifuse films AF. More specifically, for example, a metal oxide, a phase-change material, a material having an electric field excited resistance switching effect, or a resistive switching material having an electrolytic material may be used. Alternatively, an element that performs alternate switching between the high resistance state and the low resistance state, based on a voltage value may be used. Still other examples of the antifuse films AF include but are not limited to a film made of high-resistance silicon, a film made of high-resistance polysilicon, a film made of low-resistance amorphous silicon, and a composite film including one or more of these materials in part. Moreover, the antifuse films may be configured of a combination of two or more of the foregoing materials, the foregoing films, and the foregoing elements.

In this example, a portion of the antifuse film AF between the through electrode EL1 and the conductive layer LB4 (a part W1) is in the low resistance state, the antifuse film AF at a location W2 between the through electrode EL2 and the conducive layer LB2 is in the low resistance state, the antifuse film AF at a location W3 between the through electrode EL3 and the conductive layer LB1 is in the low resistance state, and the antifuse film AF at a location W4 between the through electrode EL4 and the conductive layer LB3 is in the low resistance state. In other words, each one of the through electrodes EL is electrically coupled to only one corresponding conductive layer LB of the conductive layers LB1 to LB4. This allows the row decoder 13 to be coupled to the conductive layers LB1 to LB4 through these through electrodes EL1 to EL4.

Note that, in this example, each of the antifuse films AF is formed so as to cover the through electrode EL, but the configuration of the antifuse film AF is not limited thereto. For example, the antifuse film AF may be so formed only between the through electrode EL and the conductive layer LB as to cover part of the through electrode EL. Moreover, for example, the through electrodes EL may have a hollow tubular shape. Further, a hollow space in the through electrode EL may be filled with an insulator.

The row decoder 13 (see FIG. 1) is adapted to decode a row address signal supplied from the controller 16 and supply the thus-decoded signal to the array section 11 of the memory cell array 10. The row decoder 13 is coupled to the word lines WL of the array section 11 through the through electrodes EL of the contact section 12 of the memory cell array 10. As described later, the row decoder 13 also has a function of supplying a signal to the through electrodes EL in a process of manufacturing the storage device 1 to electrically couple the through electrodes EL to the conductive layers LB.

The column decoder 14 is adapted to decode a column address signal supplied from the controller 16 and supply the thus-decoded signal to the array section 11 of the memory cell array 10. The column decoder 14 also has a function of writing, on the array section 11, data supplied from the sense amplifier-data input/output section 15 or supplying, to the sense amplifier-data input/output section 15, data read from the array section 11. The column decoder 14 is coupled to the bit lines BL and the source lines SL in the array section 11.

The sense amplifier-data input/output section 15 is adapted to amplify the data supplied from the column decoder 14. The sense amplifier-data input/output section 15 also has a function of exchanging data with outside devices and systems.

The controller 16 is adapted to control operation of the row decoder 13, the column decoder 14, and the sense amplifier-data input/output section 15.

(Operation and Workings)

Next, operation and workings of the storage device 1 according to embodiments of the present disclosure are described below.

(General Operation Outline)

First, a general operation outline of the storage device 1 is described with reference to FIG. 1. The row decoder 13 decodes the row address signal supplied from the controller 16, and supplies the thus-decoded signal to the array section 11 of the memory cell array 10. Moreover, the row decoder 13 supplies a signal to the through electrodes EL in the process of manufacturing the storage device 1 to electrically couple the through electrodes EL to the conductive layers LB. The column decoder 14 decodes the column address signal supplied from the controller 16, and supplies the thus-decoded signal to the array section 11 of the memory cell array 10. Moreover, the column decoder 14 writes, on the array section 11, the data supplied from the sense amplifier-data input/output section 15, or supplies, to the sense amplifier-data input/output section 15, the data read from the array section 11. The sense amplifier-data input/output section 15 amplifies the data supplied from the column decoder 14. Moreover, the sense amplifier-data input/output section 15 exchanges data with external devices and systems. The controller 16 controls operation of the row decoder 13, the column decoder 14, and the sense amplifier-data input/output section 15.

(Contact Section 12)

The row decoder 13 supplies a signal to the word lines WL of the memory cell array 10 through the through electrodes EL of the contact section 12. A method of manufacturing the contact section 12 is described in detail below.

Figure 4A:
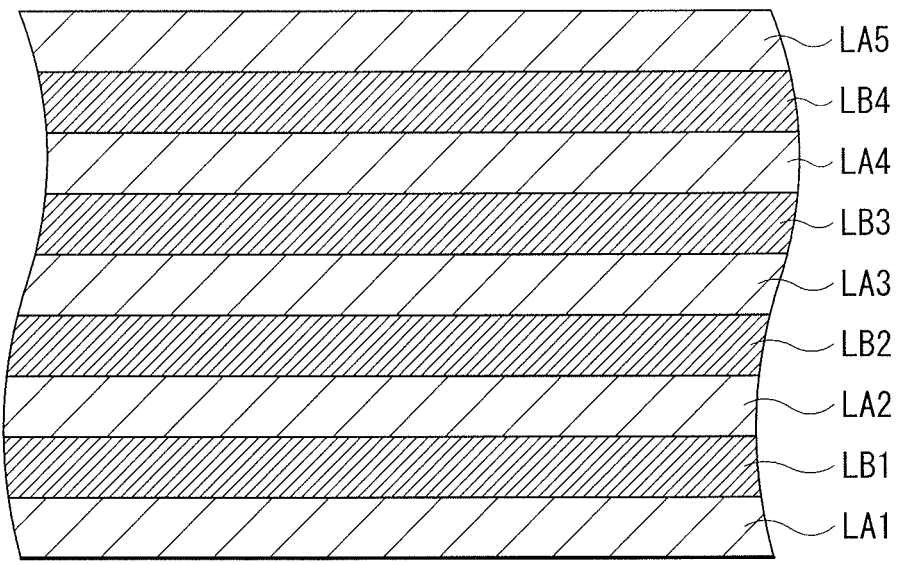
FIG. 4A is an explanatory diagram of a process in a procedure of manufacturing the contact section illustrated in FIG. 3.
Figure 4B:
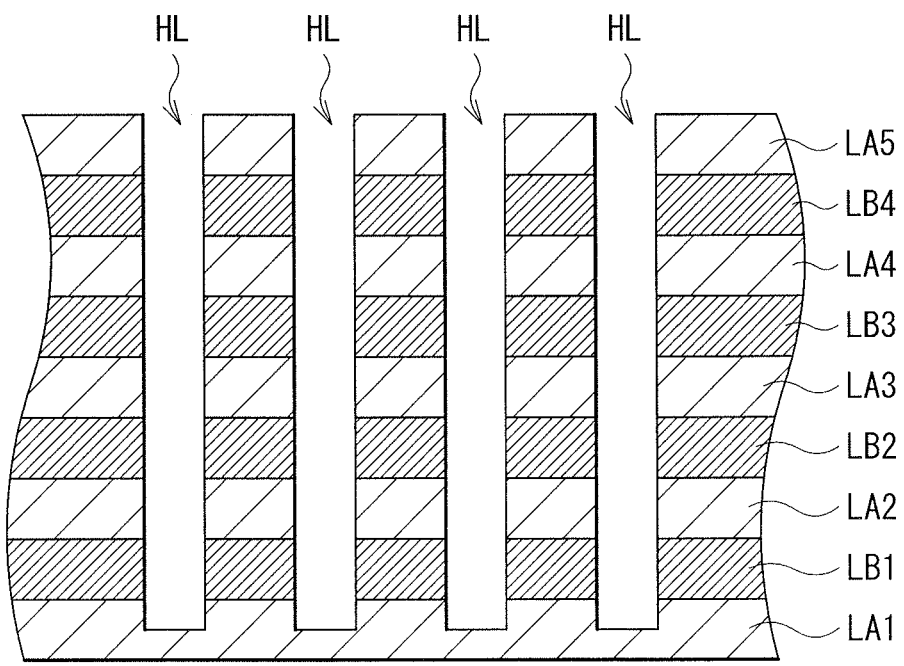
FIG. 4B is an explanatory diagram of another process in the procedure of manufacturing the contact section illustrated in FIG. 3.
Figure 4C:
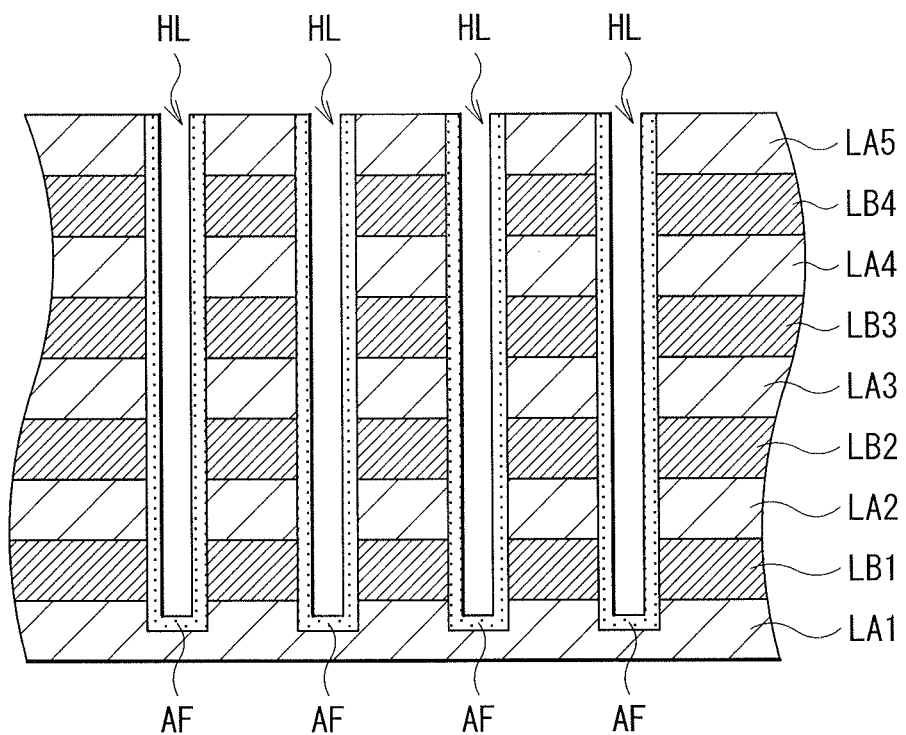
FIG. 4C is an explanatory diagram of another process in the procedure of manufacturing the contact section illustrated in FIG. 3.
Figure 4D:
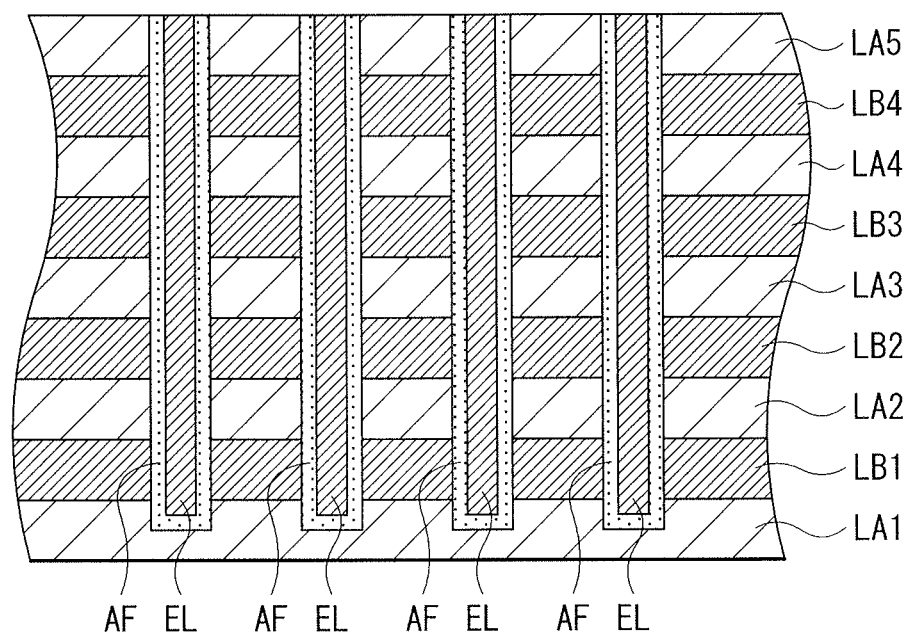
FIG. 4D is an explanatory diagram of another process in the procedure of manufacturing the contact section illustrated in FIG. 3.

FIGS. 4A to 4D illustrate an example of the method of manufacturing the contact section 12. First, as illustrated in FIG. 4A, the insulating layers LA and the conductive layers LB are alternately stacked. In this example, five insulating layers LA1 to LA5 and four conductive layers LB1 to LB4 are alternately stacked in order of LA1, LB1, LA2, LB2, LA3, LB3, LA4, LB4, and LA5. Next, as illustrated in FIG. 4B, a plurality of (four in this example) holes HL are formed so as to penetrate the insulating layers LA2 to LA5 and the conductive layers LB1 to LB4 that are stacked. Next, as illustrated in FIG. 4C, the antifuse film AF is formed on side and bottom surfaces of each of the holes HL in the insulating layers LA and the conductive layers LB. Thereafter, as illustrated in FIG. 4D, the holes HL along the sides and bottoms of which the antifuse films AF are formed are filled with a conductive material to form the through electrodes EL.

Note that it may be desirable to form the contact section 12 concurrently with manufacturing of the array section 11 by a same manufacturing process as a process of manufacturing the array section 11. More specifically, when an insulating film of a memory string formed in the array section 11 is formed, it is possible to form the antifuse films AF of the contact section 12. Moreover, when a polysilicon electrode of the memory string of the array section 11 is formed, it is possible to form the through electrodes EL of the contact section 12.

When the storage device 1 is manufactured as illustrated in FIGS. 4A to 4B, the resistance states of the antifuse films AF are in the high resistance state. Accordingly, each of the conductive layers LB1 to LB4 is in an electrically floating state.

Next, the row decoder 13 supplies a signal to the through electrodes EL to electrically couple the through electrodes EL to the conductive layers LB in the contact section 12. The following description is given of an example in which four conductive layers LB1 to LB4 and eight through electrodes EL1 to EL8 are provided and four through electrodes EL1 to EL4 are coupled to the four conductive layers LB1 to LB4.

(Through Electrode EL1)

Figure 5:
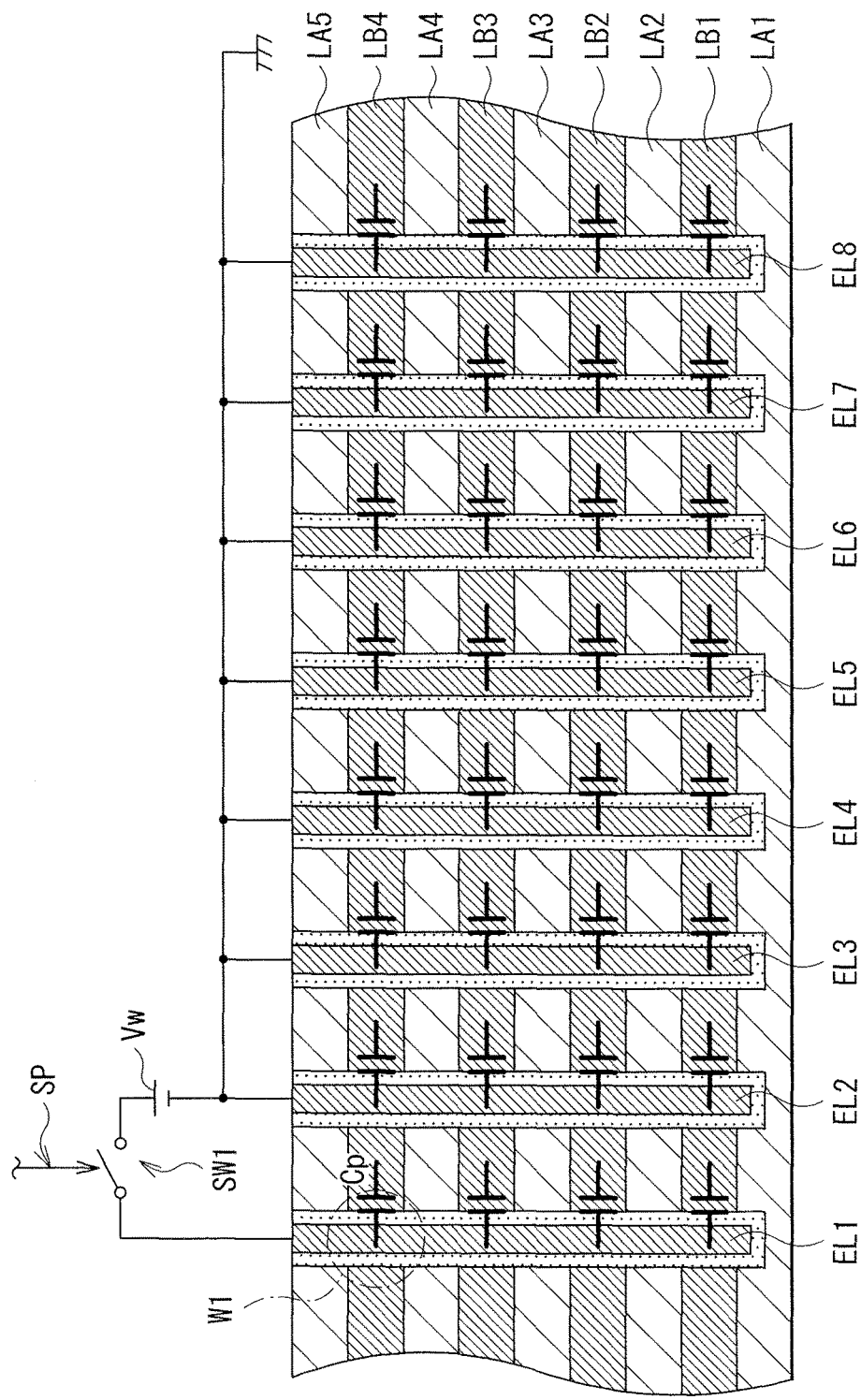
FIG. 5 is an explanatory diagram of signal application to the contact section illustrated in FIG. 3.

FIG. 5 illustrates a process of coupling the through electrode EL1 to one of the four conductive layers LB1 to LB4. At this point in the process, the antifuse films AF are all in the high resistance state, and parasitic capacitances (capacitance values Cp) are present between each of the through electrodes EL and the conductive layers LB. In processes following this process, voltages of the respective conductive layers LB are set through the parasitic capacitances by application of a voltage to the respective through electrodes EL. Thus, a stress voltage is applied to the antifuse films AF to switch the resistance states of the antifuse films AF from the high resistance state to the low resistance state.

In this process, the row decoder 13 grounds the through electrodes EL2 to EL8, except for the through electrode EL1. Moreover, the row decoder 13 turns on a switch SW1 with use of a precharge signal SP to apply a write voltage Vw to the through electrode EL1. The write voltage Vw in this example is a voltage that causes the resistance state of the antifuse film AF to be switched from the high resistance state to the low resistance state when a voltage applied to the antifuse film AF is equal to or greater than $11/16 \times Vw$.

Figure 6:
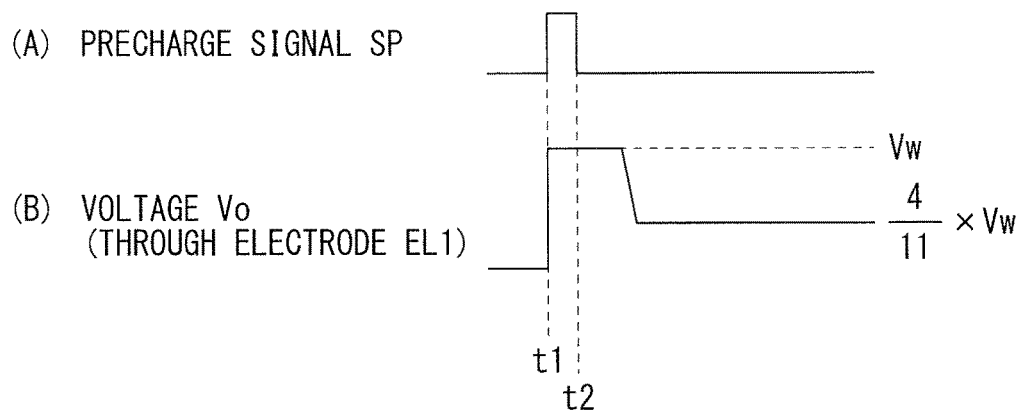
FIG. 6 is a timing waveform chart of the signal application illustrated in FIG. 5.

FIG. 6 illustrates signal application in this process, where (A) indicates a waveform of the precharge signal SP, and (B) indicates a waveform of a voltage Vo in the through electrode to which the write voltage Vw is applied (the through electrode EL1 in this example). In this example, the row decoder 13 sets the through electrode EL1 to the write voltage Vw, based on the precharge signal SP to perform precharge. Thereafter, the resistance state of the antifuse film AF between the through electrode EL1 and the conductive layer LB4 (area W1) is switched to the low resistance state. This operation is described in detail below.

First, the row decoder 13 switches the precharge signal SP from a low level to a high level at a timing t1 (see (A) of FIG. 6). The switch SW1 is thereby turned on to switch the voltage Vo of the through electrode EL1 to the write voltage Vw (see (B) of FIG. 6). Thereafter, the row decoder 13 performs precharge on the through electrode EL1 in a period from the timing t1 to a timing t2.

Figure 7:
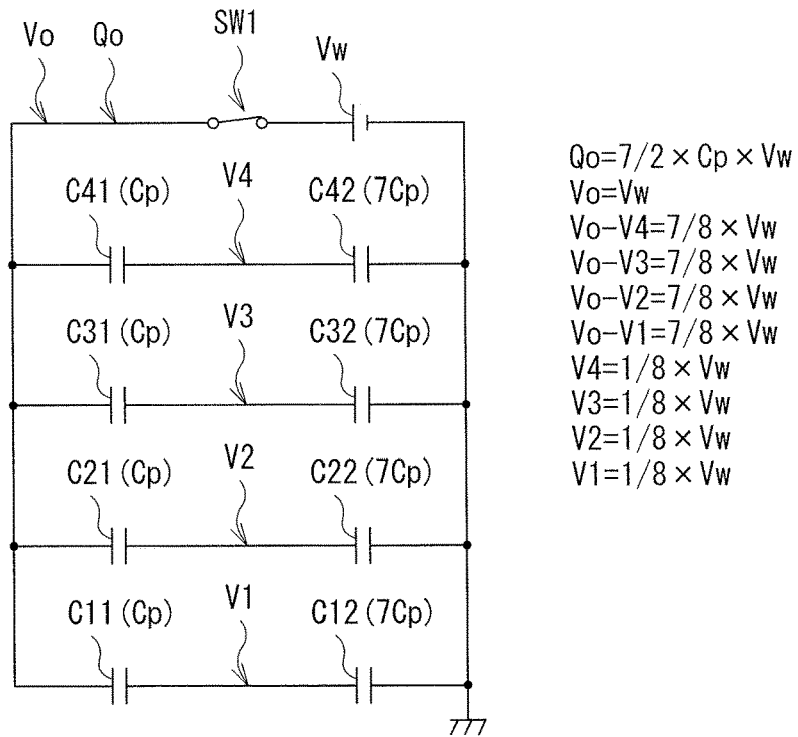
FIG. 7 is an explanatory diagram of a state in the signal application illustrated in FIG. 6.

FIG. 7 illustrates an equivalent circuit of the contact section 12 when precharge is performed on the through electrode EL1. A voltage V1 indicates a voltage in the conductive layer LB1, a voltage V2 indicates a voltage in the conductive layer LB2, a voltage V3 indicates a voltage in the conductive layer LB3, and a voltage V4 indicates a voltage in the conductive layer LB4. A capacitor C11 corresponds to a parasitic capacitance (the capacitance value Cp) between the through electrode EL1 and the conductive layer LB1. A capacitor C21 corresponds to a parasitic capacitance (the capacitance value Cp) between the through electrode EL1 and the conductive layer LB2. A capacitor C31 corresponds to a parasitic capacitance (the capacitance value Cp) between the through electrode EL1 and the conductive layer LB3. A capacitor C41 corresponds to a parasitic capacitance (the capacitance value Cp) between the through electrode EL1 and the conductive layer LB4. A capacitor C12 corresponds to a parasitic capacitance (a capacitance value 7Cp) between the through electrodes EL2 to EL8 and the conductive layer LB1. A capacitor C22 corresponds to a parasitic capacitance (the capacitance value 7Cp) between the through electrodes EL2 to EL8 and the conductive layer LB2. A capacitor C32 corresponds to a parasitic capacitance (the capacitance value 7Cp) between the through electrodes EL2 to EL8 and the conductive layer LB3. A capacitor C42 corresponds to a parasitic capacitance (the capacitance value 7Cp) between the through electrodes EL2 to EL8 and the conductive layer LB4.

At this point in the process, the electric charge Qo applied to the through electrode EL1 is $7/2 \times Cp \times Vw$. The voltage V1 in the conductive layer LB1, the voltage V2 in the conductive layer LB2, the voltage V3 in the conductive layer LB3, and the voltage V4 in the conductive layer LB4 are each $1/8 \times Vw$. In other words, a voltage between both ends of the capacitor C12, a voltage between both ends of the capacitor C22, a voltage between both ends of the capacitor C32, and a voltage between both ends of the capacitor C42 are each $1/8 \times Vw$. The voltage of $1/8 \times Vw$ is insufficient to switch the resistance state of the antifuse film AF from the high resistance state to the low resistance state. A voltage between both ends of the capacitor C11, a voltage between both ends of the capacitor C21, a voltage between both ends of the capacitor C31, and a voltage between both ends of the capacitor C41 are each $7/8 \times Vw$. The voltage of $7/8 \times Vw$ is sufficient to switch the resistance state of the antifuse film AF from the high resistance state to the low resistance state. In other words, a stress voltage is supplied to the antifuse film AF between the through electrode EL1 and each of the conductive layers LB1 to LB4.

Next, as illustrated in FIG. 6, the row decoder 13 switches the precharge signal SP from the high level to the low level at the timing t2 (see (A) of FIG. 6). Accordingly, the switch SW1 is turned off, and the state of the through electrode EL1 is switched to the electrically floating state. The state illustrated in FIG. 7 is maintained for a while after the timing t2. In other words, the stress voltage in the antifuse film AF between the through electrode EL1 and each of the conductive layers LB1 to LB4 is maintained for a while. Thereafter, the stress voltage switches, from the high resistance state to the low resistance state, the resistance state of one of the antifuse film AF between the through electrode EL1 and the conductive layer LB1, the antifuse film AF between the through electrode EL1 and the conductive layer LB2, the antifuse film AF between the through electrode EL1 and the conductive layer LB3, and the antifuse film AF between the through electrode EL1 and the conductive layer LB4. In this example, the resistance state of the antifuse film AF between the through electrode EL1 and the conductive layer LB4 (in area W1 illustrated in FIG. 5) is switched from the high resistance state to the low resistance state. Thus, the through electrode EL1 and the conductive layer LB4 are electrically coupled to each other.

Figure 8:
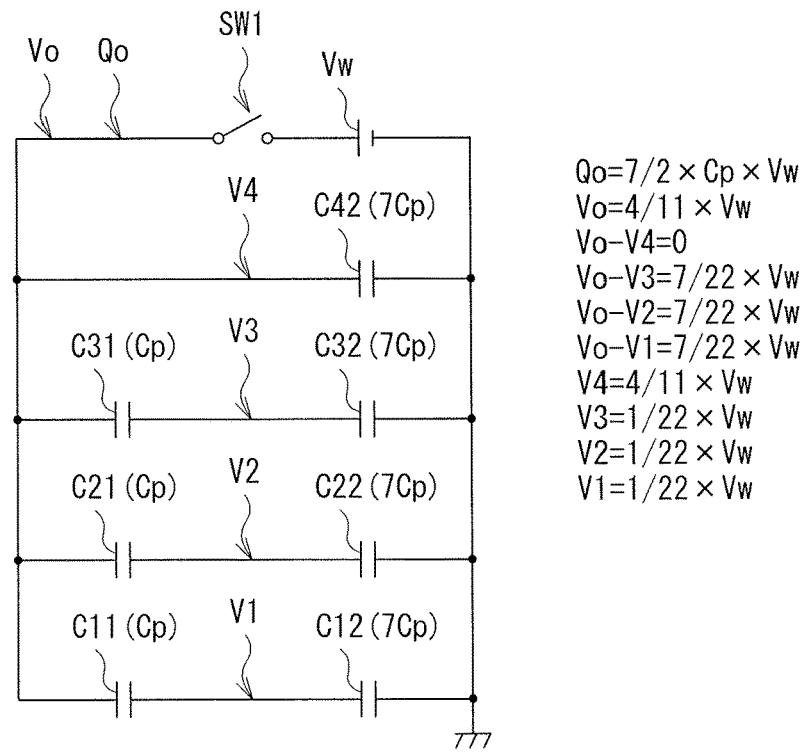
FIG. 8 is an explanatory diagram of another state in the signal application illustrated in FIG. 6.

FIG. 8 illustrates an equivalent circuit of the contact section 12 after the through electrode EL1 and the conductive layer LB4 are electrically coupled to each other. Since the through electrode EL1 and the conductive layer LB4 are electrically coupled to each other as described above, the capacitor C41 in FIG. 7 is deleted. Since the switch SW1 is kept turned off, the electric charge Qo applied to the through electrode EL1 is kept at $7/2 \times Cp \times Vw$, but the voltage Vo is decreased to $4/11 \times Vw$. The voltage V1 in the conductive layer LB1, the voltage V2 in the conductive layer LB2, and the voltage V3 in the conductive layer LB3 are each $1/22 \times Vw$, and the voltage V4 in the conductive layer LB4 is $4/11 \times Vw$. In other words, the voltage between both ends of the capacitor C12, the voltage between both ends of the capacitor C22, and the voltage between both ends of the capacitor C32 are each $1/22 \times Vw$, and the voltage between both ends of the capacitor C42 is 4/11xVw. Moreover, the voltage between both ends of the capacitor C11, the voltage between both ends of the capacitor C21, and the voltage between both ends of the capacitor C31 are each 7/22xVw. These voltages are insufficient to switch the resistance state of the antifuse film AF from the high resistance state to the low resistance state.

As illustrated in (B) of FIG. 6, the voltage Vo of the through electrode EL1 is decreased from the write voltage Vw to 4/11xVw in response to switching the resistance state of the antifuse film AF between the through electrode EL1 and the conductive layer LB4 (the part W1) from the high resistance state to the low resistance state.

Incidentally, there is negative correlation between the write voltage Vw and writing time from when the write voltage Vw is applied to when the resistance state of the antifuse film AF is switched from the high resistance state to the low resistance state. For example, when the write voltage Vw is increased, the writing time is shortened. It is necessary to set the write voltage Vw so that the resistance state of the antifuse film AF is switched from the high resistance state to the low resistance state after precharge on the through electrode EL1 is completed. In other words, if the write voltage Vw is too high, the writing time may become too short, which may cause switching of the resistance state of the antifuse film AF from the high resistance state to the low resistance state before precharge on the through electrode EL1 is completed. In this case, the resistance states of all of the antifuse film AF between the through electrode EL1 and the conductive layer LB1, the antifuse film AF between the through electrode EL1 and the conductive layer LB2, the antifuse film AF between the through electrode EL1 and the conductive layer LB3, and the antifuse film AF between the through electrode EL1 and the conductive layer LB4 may be switched from the high resistance state to the low resistance state. For this reason, the write voltage Vw is set so as to switch the resistance state of the antifuse film AF from the high resistance state to the low resistance state after precharge on the through electrode EL1 is completed. This makes it possible to switch the resistance state of the antifuse film AF between the through electrode EL1 and one of the four conductive layers LB1 to LB4 from the high resistance state to the low resistance state.

Moreover, if the write voltage Vw is too low, the writing time may become too long, and electric charge Qo applied to the through electrode EL1 may be leaked after precharge on the through electrode EL1 is completed to decrease the voltage of the through electrode EL1, which may not switch the resistance state of the antifuse film AF. For this reason, the write voltage Vw is set so as to become insusceptible to such leakage. This makes it possible to more reliably switch the resistance state of the antifuse film AF from the high resistance state to the low resistance state.

(Through Electrode EL2)

Figure 9:
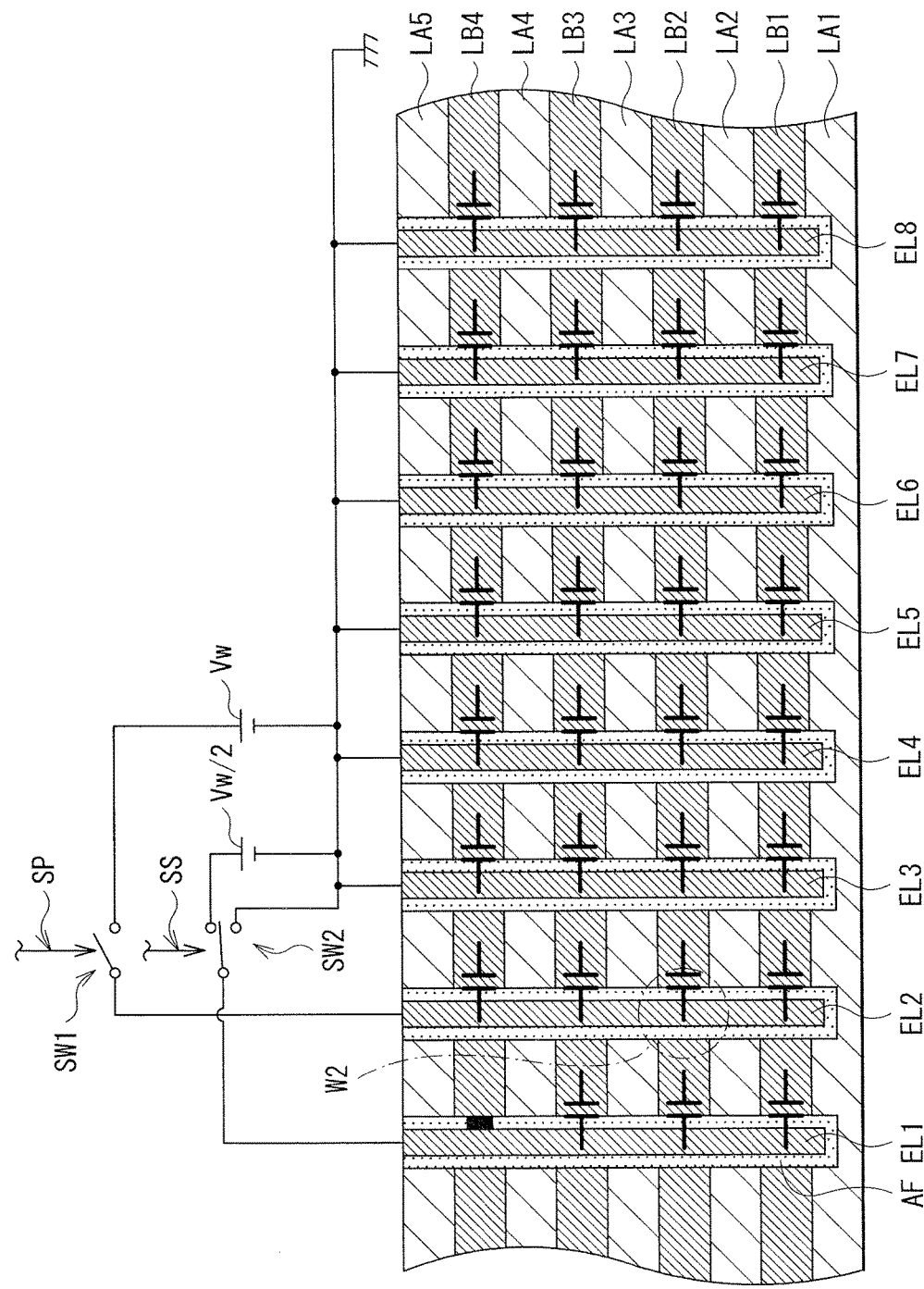
FIG. 9 is an explanatory diagram of signal application to the contact section illustrated in FIG. 3.

FIG. 9 illustrates a process of coupling the through electrode EL2 to any one of the conductive layers LB1 to LB3. In this process, the row decoder 13 grounds the through electrodes EL3 to EL8, except for the through electrodes EL1 and EL2. Moreover, the row decoder 13 controls a switch SW2 with use of a switching signal SS to apply, to the through electrode EL1, a voltage Vw/2 that is about half of the write voltage Vw. Further, the row decoder 13 turns on the switch SW1 with use of the precharge signal SP to apply the write voltage Vw to the through electrode EL2.

Figure 10:
FIG. 10 is a timing waveform chart of the signal application illustrated in FIG. 9.
Figure 10:
Figure 10:
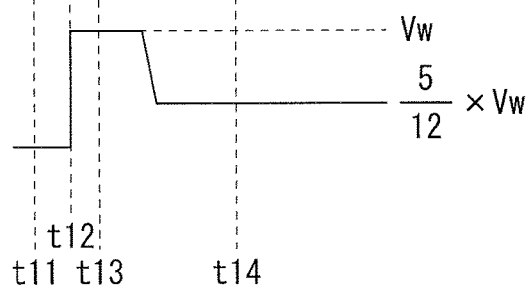

FIG. 10 illustrates signal application in this process, where (A) indicates a waveform of the switching signal SS, (B) indicates a waveform of the precharge signal SP, and (C) indicates a waveform of the voltage Vo in the through electrode to which the write voltage Vw is applied (the through electrode EL2 in this example).

First, the row decoder 13 switches the switching signal SS from the low level to the high level at a timing t11 (see (A) of FIG. 10). The voltage Vw/2 is thereby applied to the through electrode EL1 to switch the voltage of the conductive layer LB4 to the voltage Vw/2.

Next, the row decoder 13 switches the precharge signal SP from the low level to the high level at a timing t12 (see (B) of FIG. 10). The switch SW1 is thereby turned on to switch the voltage Vo of the through electrode EL2 to the write voltage Vw (see (C) of FIG. 10).

Figure 11:
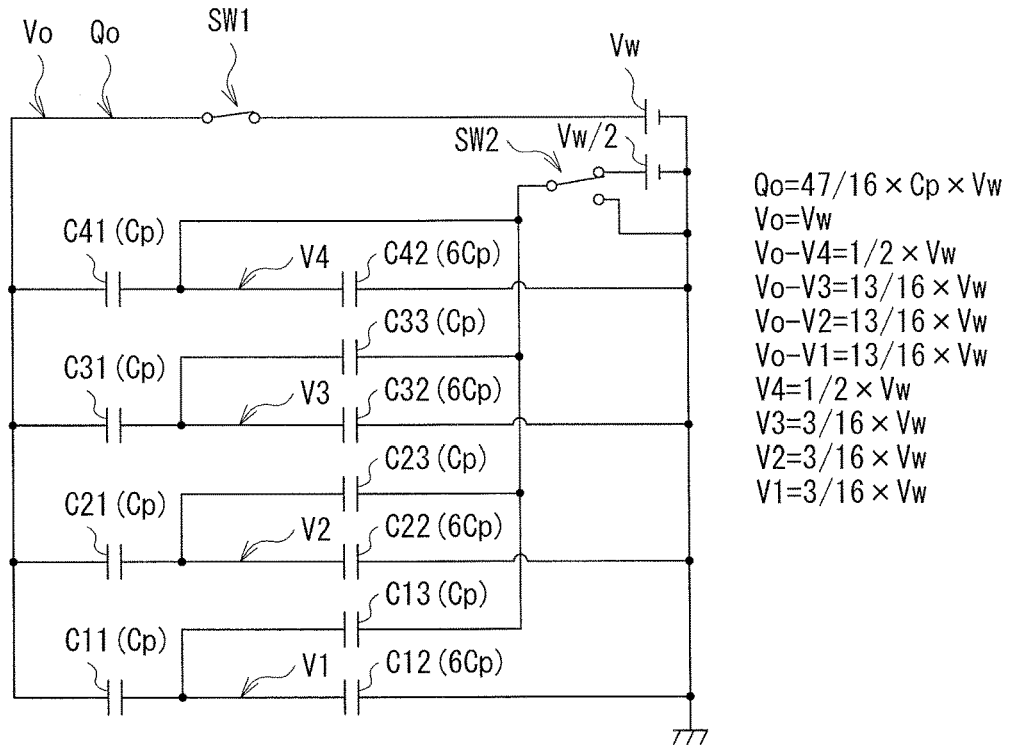
FIG. 11 is an explanatory diagram of a state in the signal application illustrated in FIG. 10.

FIG. 11 illustrates an equivalent circuit of the contact section 12 when precharge is performed on the through electrode EL2. The capacitor C11 corresponds to a parasitic capacitance (the capacitance value Cp) between the through electrode EL2 and the conductive layer LB1. The capacitor C21 corresponds to a parasitic capacitance (the capacitance value Cp) between the through electrode EL2 and the conductive layer LB2. The capacitor C31 corresponds to a parasitic capacitance (the capacitance value Cp) between the through electrode EL2 and the conductive layer LB3. The capacitor C41 corresponds to a parasitic capacitance (the capacitance value Cp) between the through electrode EL2 and the conductive layer LB4. The capacitor C12 corresponds to a parasitic capacitance (a capacitance value 6Cp) between the through electrodes EL3 to EL8 and the conductive layer LB1. The capacitor C22 corresponds to a parasitic capacitance (the capacitance value 6Cp) between the through electrodes EL3 to EL8 and the conductive layer LB2. The capacitor C32 corresponds to a parasitic capacitance (the capacitance value 6Cp) between the through electrodes EL3 to EL8 and the conductive layer LB3. The capacitor C42 corresponds to a parasitic capacitance (the capacitance value 6Cp) between the through electrodes EL3 to EL8 and the conductive layer LB4. The capacitor C13 corresponds to a parasitic capacitance (the capacitance value Cp) between the through electrode EL1 and the conductive layer LB1. The capacitor C23 corresponds to a parasitic capacitance (the capacitance value Cp) between the through electrode EL1 and the conductive layer LB2. The capacitor C33 corresponds to a parasitic capacitance (the capacitance value Cp) between the through electrode EL1 and the conductive layer LB3.

At this point, the electric charge Qo applied to the through electrode EL2 is 47/16xCpxVw. Moreover, the voltage V1 in the conductive layer LB1, the voltage V2 in the conductive layer LB2, and the voltage V3 in the conductive layer LB3 are each 3/16xVw, and the voltage V4 in the conductive layer LB4 is 1/2xVw. In other words, the voltages between both ends of the capacitors excluding the capacitors C11, C21, and C31 are insufficient to switch the resistance state of the antifuse film AF from the high resistance state to the low resistance state. The voltage between both ends of each of the capacitors C11, C21, and C31 makes it possible to switch the resistance state of the antifuse film AF from the high resistance state to the low resistance state. In other words, the stress voltage is supplied to the antifuse film AF between the through electrode EL2 and each of the conductive layers LB1 to LB3.

Next, as illustrated in FIG. 10, the row decoder 13 switches the precharge signal SP from the high level to the low level at a timing t13 (see (B) of FIG. 10). Accordingly, the switch SW1 is turned off, and the through electrode EL2 is switched to the electrically floating state. A state illustrated in FIG. 11 is maintained for a while after the timing t13. In other words, the stress voltage in the antifuse film AF between the through electrode EL2 and each of the conductive layers LB1 to LB3 is maintained for a while. Thereafter, the stress voltage switches, from the high resistance state to the low resistance state, the resistance state of one of the antifuse film AF between the through electrode EL2 and the conductive layer LB1, the antifuse film AF between the through electrode EL2 and the conductive layer LB2, and the antifuse film AF between the through electrode EL2 and the conductive layer LB3. In this example, the resistance state of the antifuse film AF between the through electrode EL2 and the conductive layer LB2 (the part W2 illustrated in FIG. 9) is switched from the high resistance state to the low resistance state. Thus, the through electrode EL2 and the conductive layer LB2 are electrically coupled to each other.

Figure 12:
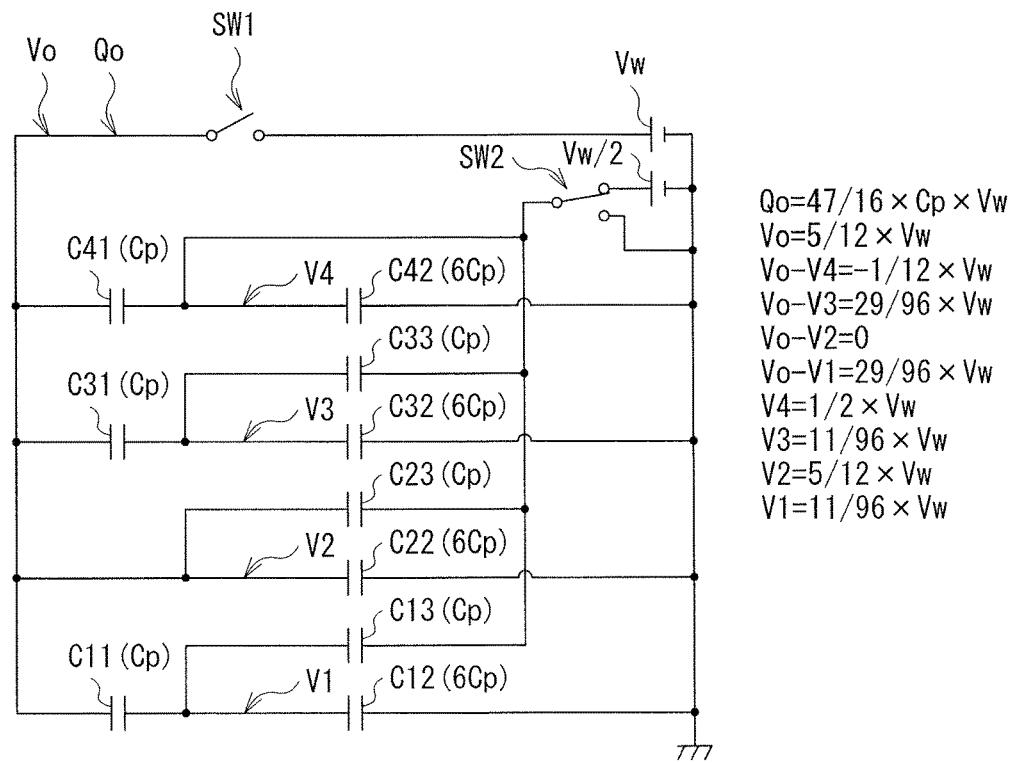
FIG. 12 is an explanatory diagram of another state in the signal application illustrated in FIG. 10.

FIG. 12 illustrates an equivalent circuit of the contact section 12 after the through electrode EL2 and the conductive layer LB2 are electrically coupled to each other. Since the through electrode EL2 and the conductive layer LB2 are electrically coupled to each other as described above, the capacitor C21 in FIG. 11 is deleted. Since the switch SW1 is kept turned off, the electric charge Qo applied to the through electrode EL2 is kept at $47/16 \times C_p \times V_w$, but the voltage Vo is decreased to $5/12 \times V_w$. At this point, the voltage between both ends of each of the capacitors is insufficient to switch the resistance state of the antifuse film AF from the high resistance state to the low resistance state.

As illustrated in (C) of FIG. 10, the voltage Vo of the through electrode EL2 is decreased from the write voltage Vw to $5/12 \times V_w$ in response to switching the resistance state of the antifuse film AF between the through electrode EL2 and the conductive layer LB2 (the part W2) from the high resistance state to the low resistance state.

Thereafter, the row decoder 13 switches the switching signal SS from the high level to the low level at a time t14 (see (A) of FIG. 10). Thus, the through electrode EL1 is grounded to ground the conductive layer LB4.

(Through Electrode EL3)

Figure 13:
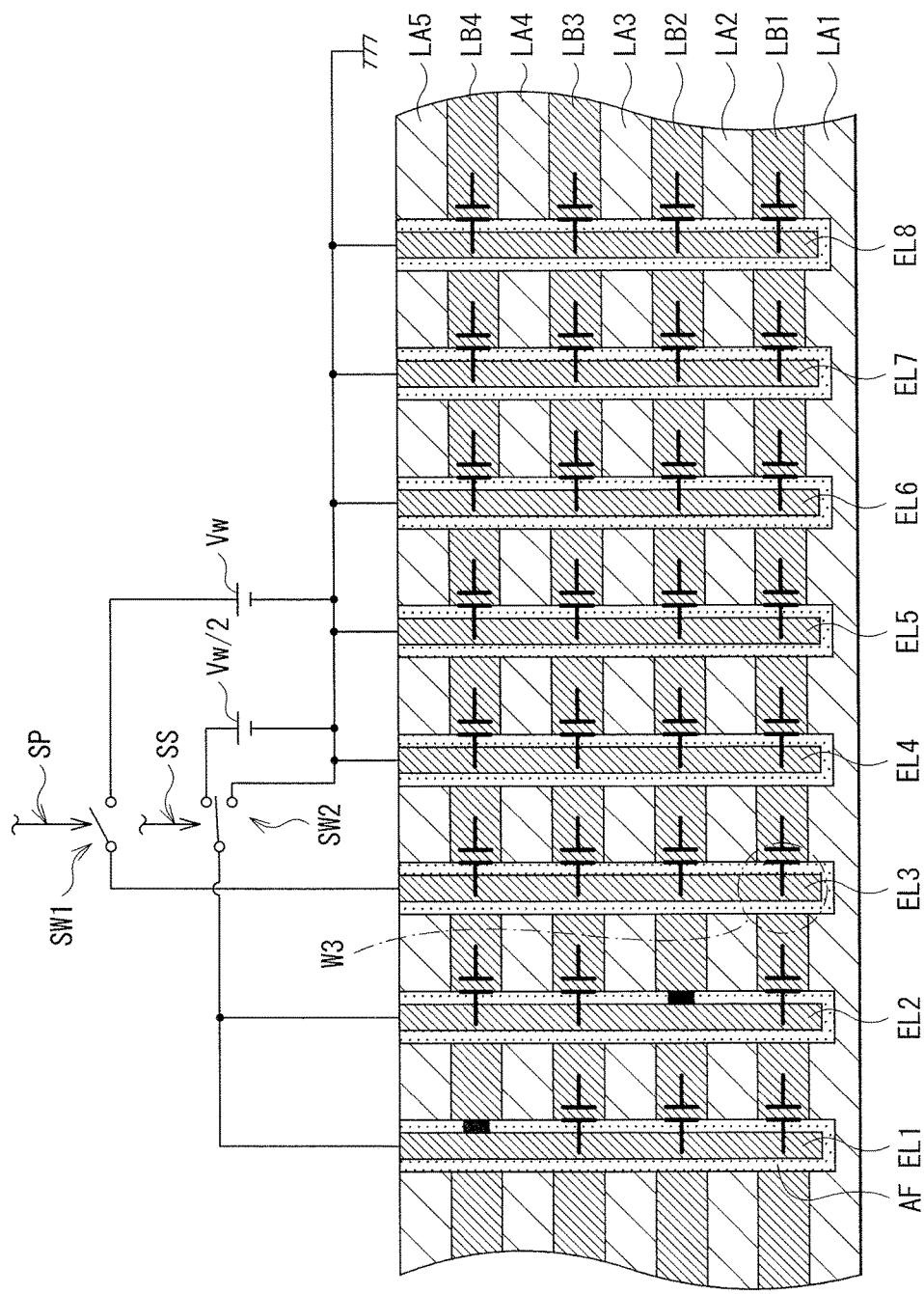
FIG. 13 is an explanatory diagram of signal application to the contact section illustrated in FIG. 3.

FIG. 13 illustrates a process of coupling the through electrode EL3 to one of the conductive layers LB1 and LB3. In this process, the row decoder 13 grounds the through electrodes EL4 to EL8, except for the through electrodes EL1 to EL3. Moreover, the row decoder 13 controls the switch SW2 with use of the switching signal SS to apply, to the through electrodes EL1 and EL2, a voltage Vw/2 that is about half of the write voltage Vw. Further, the row decoder 13 turns on the switch SW1 with use of the precharge signal SP to apply the write voltage Vw to the through electrode EL3.

Figure 14:
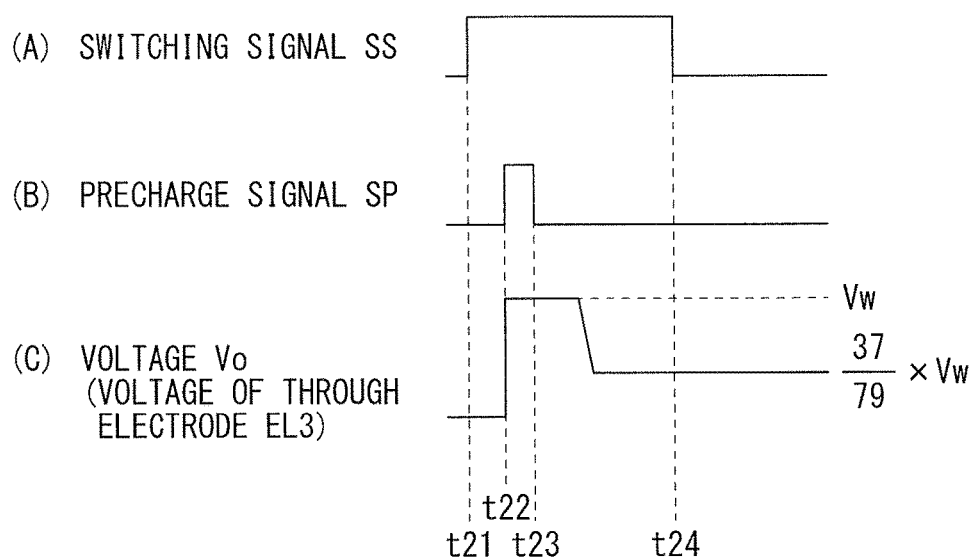
FIG. 14 is a timing waveform chart of the signal application illustrated in FIG. 13.

FIG. 14 illustrates signal application in this process, where (A) indicates a waveform of the switching signal SS, (B) indicates a waveform of the precharge signal SP, and (C) indicates a waveform of the through electrode to which the write voltage Vw is applied (the through electrode EL3 in this example).

First, the row decoder 13 switches the switching signal SS from the low level to the high level at a time t21 (see (A) of FIG. 14). The voltage Vw/2 is thereby applied to the through electrodes EL1 and EL2 to switch the voltages of the conductive layers LB2 and LB4 to the voltage Vw/2.

Next, the row decoder 13 switches the precharge signal SP from the low level to the high level at a time t22 (see (B) of FIG. 14). The switch SW1 is thereby turned on to switch the voltage Vo of the through electrode EL3 to the write voltage Vw (see (C) of FIG. 14).

Figure 15:
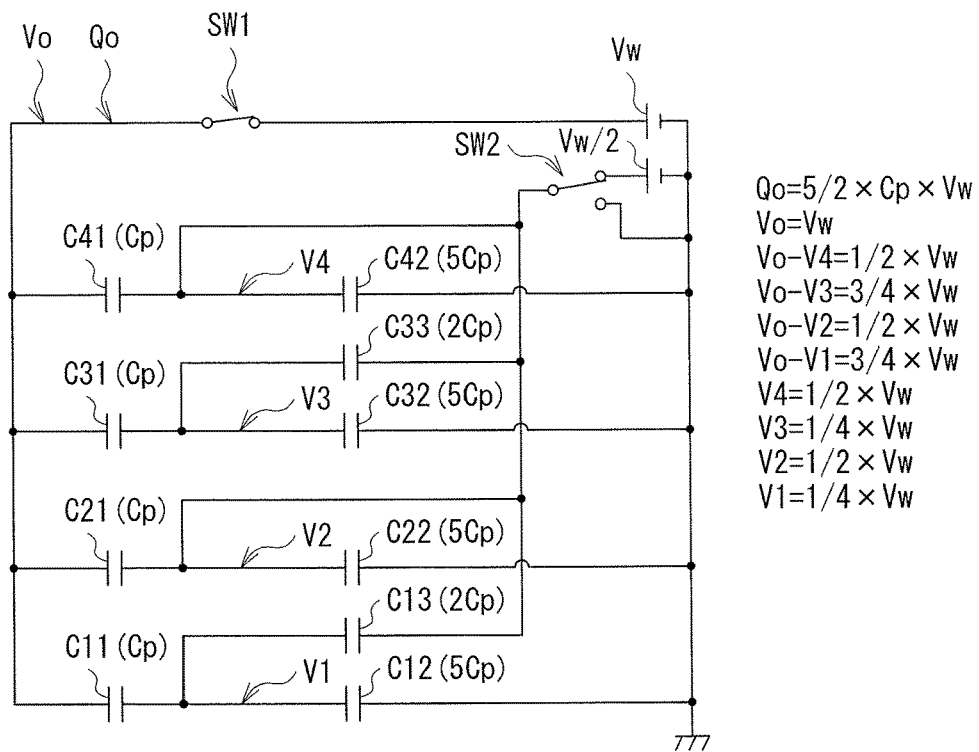
FIG. 15 is an explanatory diagram of a state in the signal application illustrated in FIG. 14.

FIG. 15 illustrates an equivalent circuit of the contact section 12 when precharge is performed on the through electrode EL3. The capacitor C11 corresponds to a parasitic capacitance (the capacitance value Cp) between the through electrode EL3 and the conductive layer LB1. The capacitor C21 corresponds to a parasitic capacitance (the capacitance value Cp) between the through electrode EL3 and the conductive layer LB2. The capacitor C31 corresponds to a parasitic capacitance (the capacitance value Cp) between the through electrode EL3 and the conductive layer LB3. The capacitor C41 corresponds to a parasitic capacitance (the capacitance value Cp) between the through electrode EL3 and the conductive layer LB4. The capacitor C12 corresponds to a parasitic capacitance (a capacitance value 5Cp) between the through electrodes EL4 to EL8 and the conductive layer LB1. The capacitor C22 corresponds to a parasitic capacitance (the capacitance value 5Cp) between the through electrodes EL4 to EL8 and the conductive layer LB2. The capacitor C32 corresponds to a parasitic capacitance (the capacitance value 5Cp) between the through electrodes EL4 to EL8 and the conductive layer LB3. The capacitor C42 corresponds to a parasitic capacitance (the capacitance value 5Cp) between the through electrodes EL4 to EL8 and the conductive layer LB4. The capacitor C13 corresponds to a parasitic capacitance (the capacitance value 2Cp) between the through electrodes EL1 and EL2 and the conductive layer LB1. The capacitor C33 corresponds to a parasitic capacitance (the capacitance value 2Cp) between the through electrodes EL1 and EL2 and the conductive layer LB3.

At this point, the electric charge Qo applied to the through electrode EL3 is $5/2 \times C_p \times V_w$. Moreover, the voltage V1 in the conductive layer LB1 and the voltage V3 in the conductive layer LB3 are each $1/4 \times V_w$, and the voltage V2 in the conductive layer LB2 and the voltage V4 in the conductive layer LB4 are each $1/2 \times V_w$. In other words, the voltages between both ends of the capacitors excluding the capacitors C11 and C31 is insufficient to switch the resistance state of the antifuse film AF from the high resistance state to the low resistance state. The voltage between both ends of each of the capacitors C11 and C31 makes it possible to switch the resistance state of the antifuse film AF from the high resistance state to the low resistance state. In other words, the stress voltage is supplied to the antifuse film AF between the through electrode EL3 and each of the conductive layers LB1 and LB3.

Next, as illustrated in FIG. 14, the row decoder 13 switches the precharge signal SP from the high level to the low level at a time t23 (see (B) of FIG. 14). Accordingly, the switch SW1 is turned off, and the through electrode EL3 is switched to the electrically floating state. A state illustrated in FIG. 15 is maintained for a while after the timing t23. In other words, the stress voltage in the antifuse film AF between the through electrode EL3 and each of the conductive layers LB1 and LB3 is maintained for a while. Thereafter, the stress voltage switches, from the high resistance state to the low resistance state, the resistance state of one of the antifuse film AF between the through electrode EL3 and the conductive layer LB1 and the antifuse film AF between the through electrode EL3 and the conductive layer LB3. In this example, the resistance state of the part of the antifuse film AF between the through electrode EL3 and the conductive layer LB1 (the part W3 illustrated in FIG. 13) is switched from the high resistance state to the low resistance state. Thus, the through electrode EL3 and the conductive layer LB1 are electrically coupled to each other.

Figure 16:
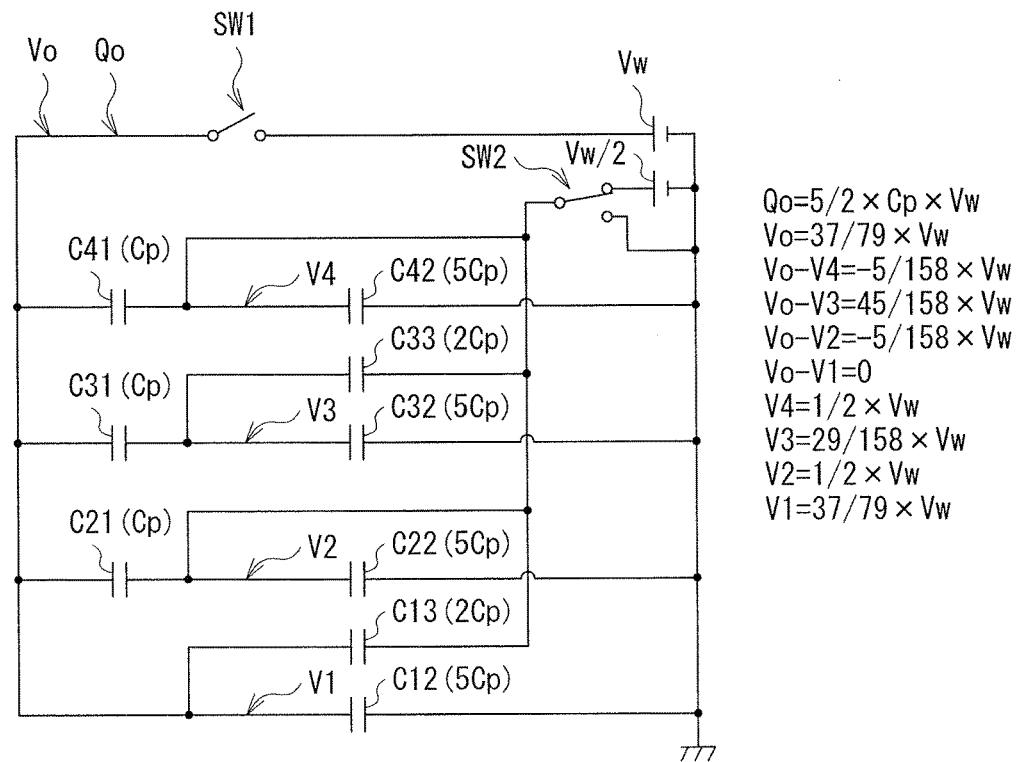
FIG. 16 is an explanatory diagram of another state in the signal application illustrated in FIG. 14.

FIG. 16 illustrates an equivalent circuit of the contact section 12 after the through electrode EL3 and the conductive layer LB1 are electrically coupled to each other. Since the through electrode EL3 and the conductive layer LB1 are electrically coupled to each other as described above, the capacitor C11 in FIG. 15 is deleted. Since the switch SW1 is kept turned off, the electric charge Qo applied to the through electrode EL3 is kept at 5/2×CpxVw, but the voltage Vo is decreased to 37/79×Vw. At this point, the voltage between both ends of each of the capacitors is insufficient to switch the resistance state of the antifuse film AF from the high resistance state to the low resistance state.

As illustrated in (C) of FIG. 14, the voltage Vo of the through electrode EL3 is decreased from the write voltage Vw to 37/79×Vw in response to switching the resistance state of the antifuse film AF between the through electrode EL3 and the conductive layer LB1 (the part W3) from the high resistance state to the low resistance state.

Thereafter, the row decoder 13 switches the switching signal SS from the high level to the low level at a timing t24 (see (A) of FIG. 14). Thus, the through electrodes EL1 and EL2 are grounded to ground the conductive layers LB2 and LB4.

(Through Electrode EL4)

Figure 17:
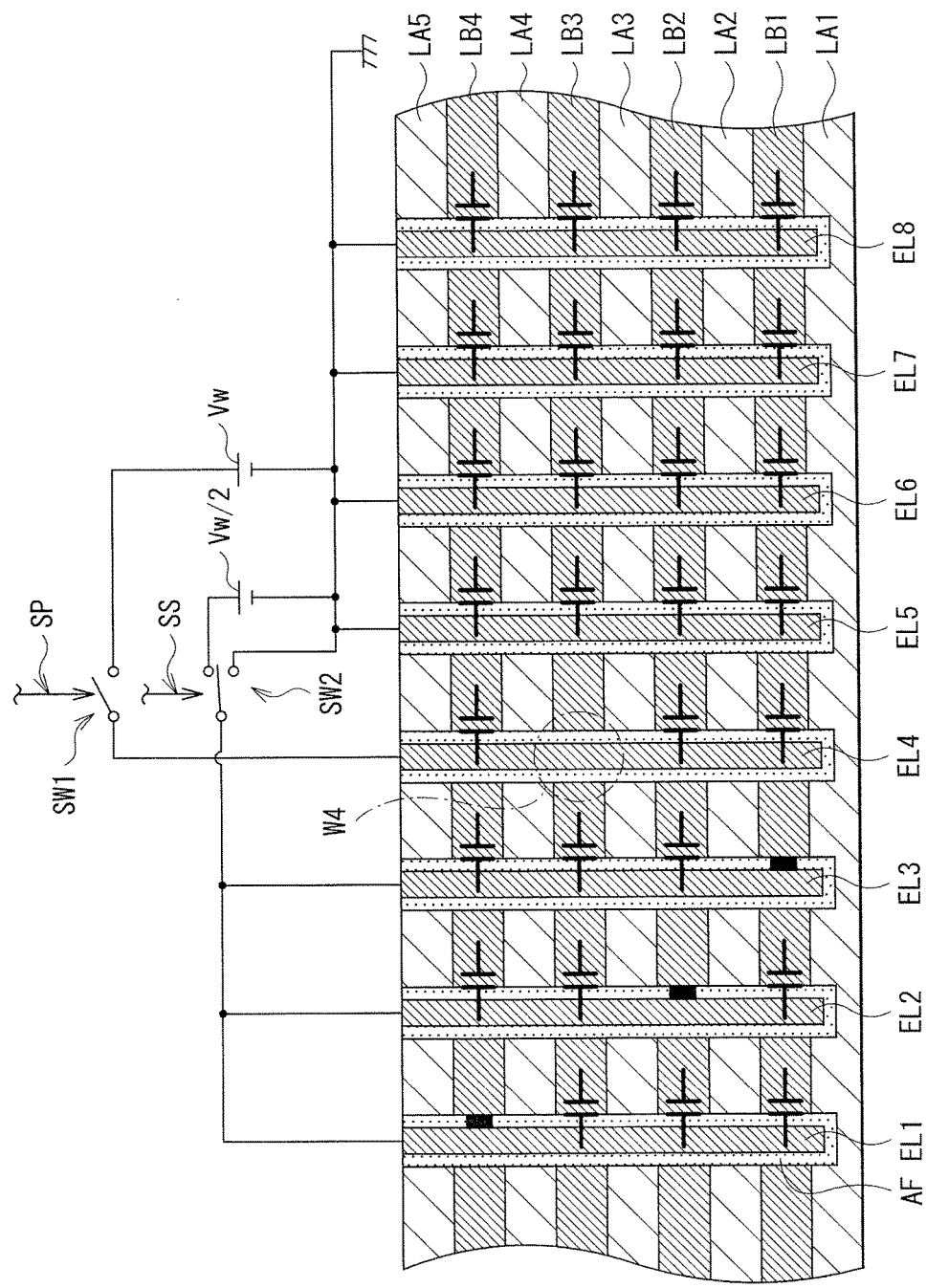
FIG. 17 is an explanatory diagram of signal application to the contact section illustrated in FIG. 3.

FIG. 17 illustrates a process of coupling the through electrode EL4 to the conductive layer LB3. In this process, the row decoder 13 grounds the through electrodes EL5 to EL8, except for the through electrodes EL1 to EL4. Moreover, the row decoder 13 controls the switch SW2 with use of the switching signal SS to apply, to the through electrodes EL1 to EL3, a voltage Vw/2 that is about half of the write voltage Vw. Further, the row decoder 13 turns on the switch SW1 with use of the precharge signal SP to apply the write voltage Vw to the through electrode EL4.

Figure 18:
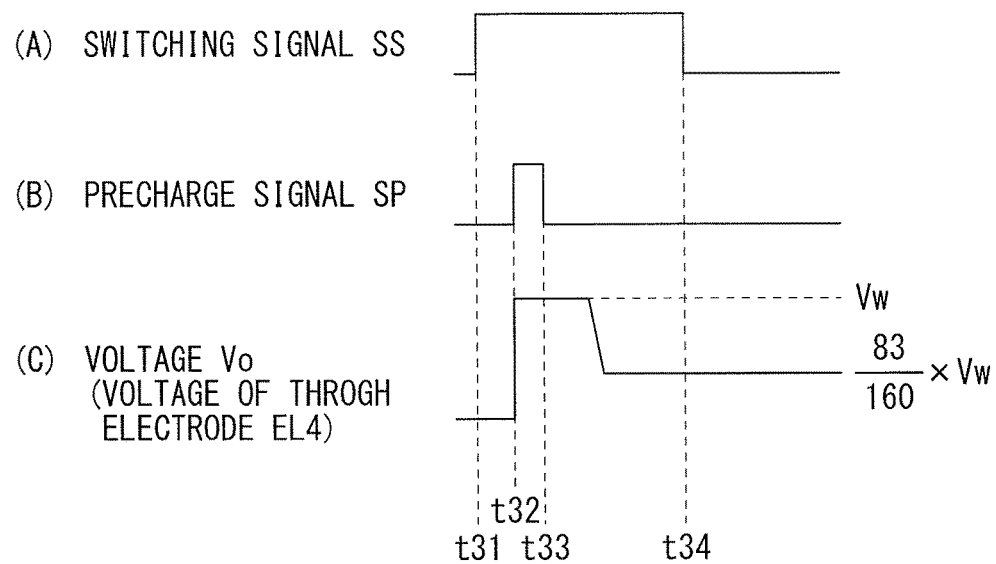
FIG. 18 is a timing waveform chart of the signal application illustrated in FIG. 17.

FIG. 18 illustrates signal application in this process, where (A) indicates a waveform of the switching signal SS, (B) indicates a waveform of the precharge signal SP, and (C) indicates a waveform of the voltage Vo of the through electrode to which the write voltage Vw is applied (the through electrode EL4 in this example).

First, the row decoder 13 switches the switching signal SS from the low level to the high level at a time t31 (see (A) of FIG. 18). The voltage Vw/2 is thereby applied to the through electrodes EL1 to EL3 to switch the voltages of the conductive layers LB1, LB2, and LB4 to the voltage Vw/2.

Next, the row decoder 13 switches the precharge signal SP from the low level to the high level at a time t32 (see (B) of FIG. 18). The switch SW1 is thereby turned on to switch the voltage Vo of the through electrode EL4 to the write voltage Vw (see (C) of FIG. 18).

Figure 19:
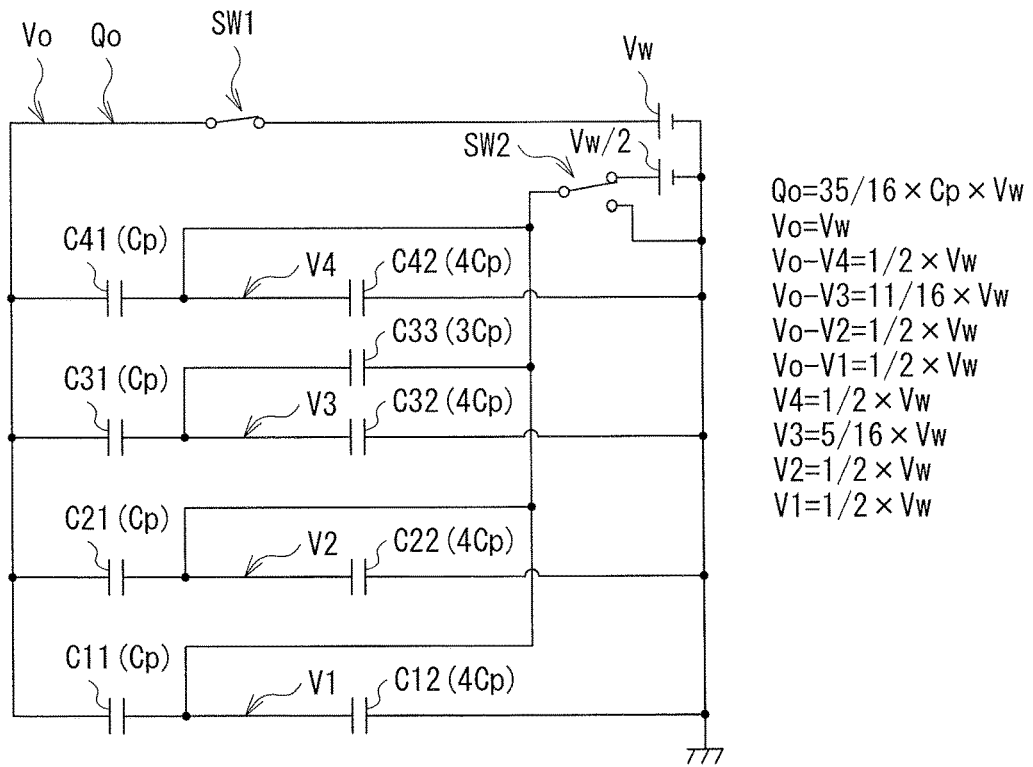
FIG. 19 is an explanatory diagram of a state in the signal application illustrated in FIG. 18.

FIG. 19 illustrates an equivalent circuit of the contact section 12 when precharge is performed on the through electrode EL4. The capacitor C11 corresponds to a parasitic capacitance (the capacitance value Cp) between the through electrode EL4 and the conductive layer LB1. The capacitor C21 corresponds to a parasitic capacitance (the capacitance value Cp) between the through electrode EL4 and the conductive layer LB2. The capacitor C31 corresponds to a parasitic capacitance (the capacitance value Cp) between the through electrode EL4 and the conductive layer LB3. The capacitor C41 corresponds to a parasitic capacitance (the capacitance value Cp) between the through electrode EL4 and the conductive layer LB4. The capacitor C12 corresponds to a parasitic capacitance (a capacitance value 4Cp) between the through electrodes EL5 to EL8 and the conductive layer LB1. The capacitor C22 corresponds to a parasitic capacitance (a capacitance value 4Cp) between the through electrodes EL5 to EL8 and the conductive layer LB2. The capacitor C32 corresponds to a parasitic capacitance (the capacitance value 4Cp) between the through electrodes EL5 to EL8 and the conductive layer LB3. The capacitor C42 corresponds to a parasitic capacitance (the capacitance value 4Cp) between the through electrodes EL5 to EL8 and the conductive layer LB4. The capacitor C33 corresponds to a parasitic capacitance (a capacitance value 3Cp) between the through electrodes EL1 to EL3 and the conductive layer LB3.

At this point, the electric charge Qo applied to the through electrode EL4 is 35/16×CpxVw. Moreover, the voltage V3 in the conductive layer LB3 is 5/16×Vw, and the voltage V1 in the conductive layer LB1, the voltage V2 in the conductive layer LB2, and the voltage V4 in the conductive layer LB4 are each 1/2×Vw. In other words, the voltages between both ends of the capacitors excluding the capacitor C31 are insufficient to switch the resistance state of the antifuse film AF from the low resistance state to the high resistance state. The voltage between both ends of the capacitor C31 makes it possible to switch the resistance state of the antifuse film AF from the high resistance state to the low resistance state. In other words, the stress voltage is supplied to the antifuse film AF between the through electrode EL4 and the conductive layer LB3.

Next, as illustrated in FIG. 18, the row decoder 13 switches the precharge signal SP from the high level to the low level at a time t33 (see (B) of FIG. 14). Accordingly, the switch SW1 is turned off, and the through electrode EL3 is switched to the electrically floating state. A state illustrated in FIG. 19 is maintained for a while after the time t33. In other words, the stress voltage in the antifuse film AF between the through electrode EL4 and the conductive layer LB3 is maintained for a while. Thereafter, the stress voltage switches the resistance state of the portion of the antifuse film AF between the through electrode EL4 and the conductive layer LB3 (the part W4 in FIG. 17) from the high resistance state to the low resistance state. Thus, the through electrode EL4 and the conductive layer LB3 are electrically coupled to each other.

Figure 20:
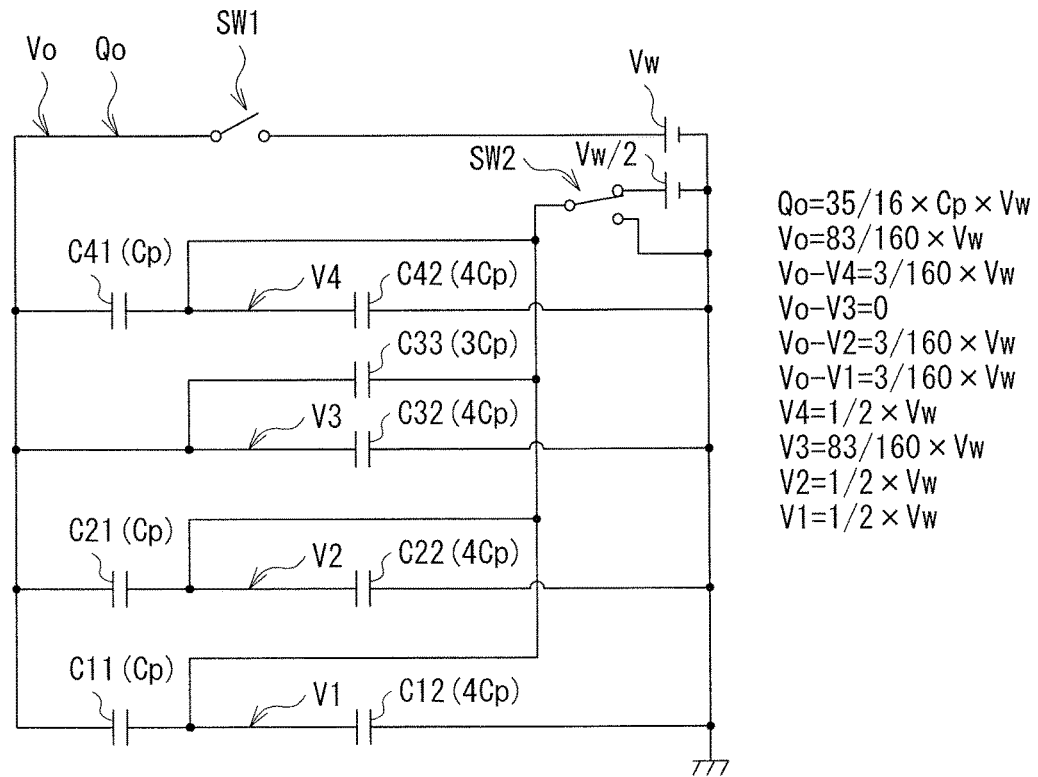
FIG. 20 is an explanatory diagram of another state in the signal application illustrated in FIG. 18.

FIG. 20 illustrates an equivalent circuit of the contact section 12 after the through electrode EL4 and the conductive layer LB3 are electrically coupled to each other. Since the through electrode EL4 and the conductive layer LB3 are electrically coupled to each other as described above, the capacitor C31 in FIG. 19 is deleted. Since the switch SW1 is kept turned off, the electric charge Qo applied to the through electrode EL4 is kept at 35/16×CpxVw, but the voltage Vo is decreased to 83/160×Vw. At this occasion, the voltage between both ends of each of the capacitors is insufficient to switch the resistance state of the antifuse film AF from the high resistance state to the low resistance state.

As illustrated in (C) of FIG. 18, the voltage Vo of the through electrode EL4 is decreased from the write voltage Vw to 83/160×Vw in response to switching of the resistance state of the antifuse film AF between the portion of the through electrode EL4 and the conductive layer LB3 (the part W4) from the high resistance state to the low resistance state.

Thereafter, the row decoder 13 switches the switching signal SS from the high level to the low level at a timing t34 (see (A) of FIG. 18). Thus, the through electrodes EL1 to EL3 are grounded to ground the conductive layers LB1, LB2 and LB4.

As described above, the through electrode EL1 is electrically coupled to the conductive layer LB4, the through electrode EL2 is electrically coupled to the conductive layer LB2, the through electrode EL3 is electrically coupled to the conductive layer LB1, and the through electrode EL4 is electrically coupled to the conductive layer LB3.

Note that since a combination of the through electrode EL and the conductive layer LB coupled to the through electrode EL depends on, for example but not limited to, element variation, it is difficult to uniquely determine the combination. However, each one of the through electrodes EL is coupled to corresponding one of the conductive layers LB, and correspondences between logical addresses and physical addresses are not overlapped. Thus, difficulty in uniquely determining the combination is not disadvantageous for a user of the device.

In the storage device 1, the through electrodes EL are formed so as to penetrate the insulating layers LA and the conductive layers LB that are stacked in the contact section 12, and the antifuse films AF are formed so as to cover the through electrodes EL. This makes it possible to reduce the area of the storage device 1. In contrast, technologies disclosed in, for example, PTLs 1 and 2, a plurality of conductive layers are formed in a stepwise fashion in a contact section, which increase the area of the contact section, thereby increasing the area of the storage device. In the storage device 1, the insulating layers LA and the conductive layers LB are stacked in the contact section 12 in a similar manner to that in the array section 11 so as to couple the row decoder 13 to the conductive layers LB through the through electrodes EL. This makes it possible to reduce the area of the contact section as compared to other arrangements, thereby reducing the area of the storage device.

Moreover, in the storage device 1, the through electrodes EL are formed so as to penetrate the insulating layers LA and the conductive layers LB that are stacked, and thereafter, the stress voltage is applied to the antifuse films AF to electrically couple the through electrodes EL to the conductive layers LB. This makes it possible to reduce the number of manufacturing processes. In contrast, in, for example, the technologies in PTLs 1 and 2, after the plurality of conductive layers are formed in a stepwise fashion, contacts to the conductive layers are formed in separate steps. In other words, in order to form the contacts in these other arrangements, the same number of processes as the number of conductive layers are necessary. In the storage device 1, the stress voltage is applied to the antifuse films AF to electrically couple the through electrodes EL to the conductive layers LB. This makes it possible to reduce the number of manufacturing processes in the storage device 1, thereby reducing manufacturing cost.

(About Number of Through Electrodes EL)

In the above-described example, four conductive layers LB1 to LB4 and eight through electrodes EL1 to EL8 are provided. When the number of through electrodes EL is small, the through electrode EL and the conductive layer LB may not be coupled to each other properly. Description is given below with an example in which four conductive layers LB1 to LB4 and five through electrodes EL1 to EL5 are provided (reference example R1) and an example in which four conductive layers LB1 to LB4 and six through electrodes EL1 to EL6 are provided (reference example R2).

Figure 21:
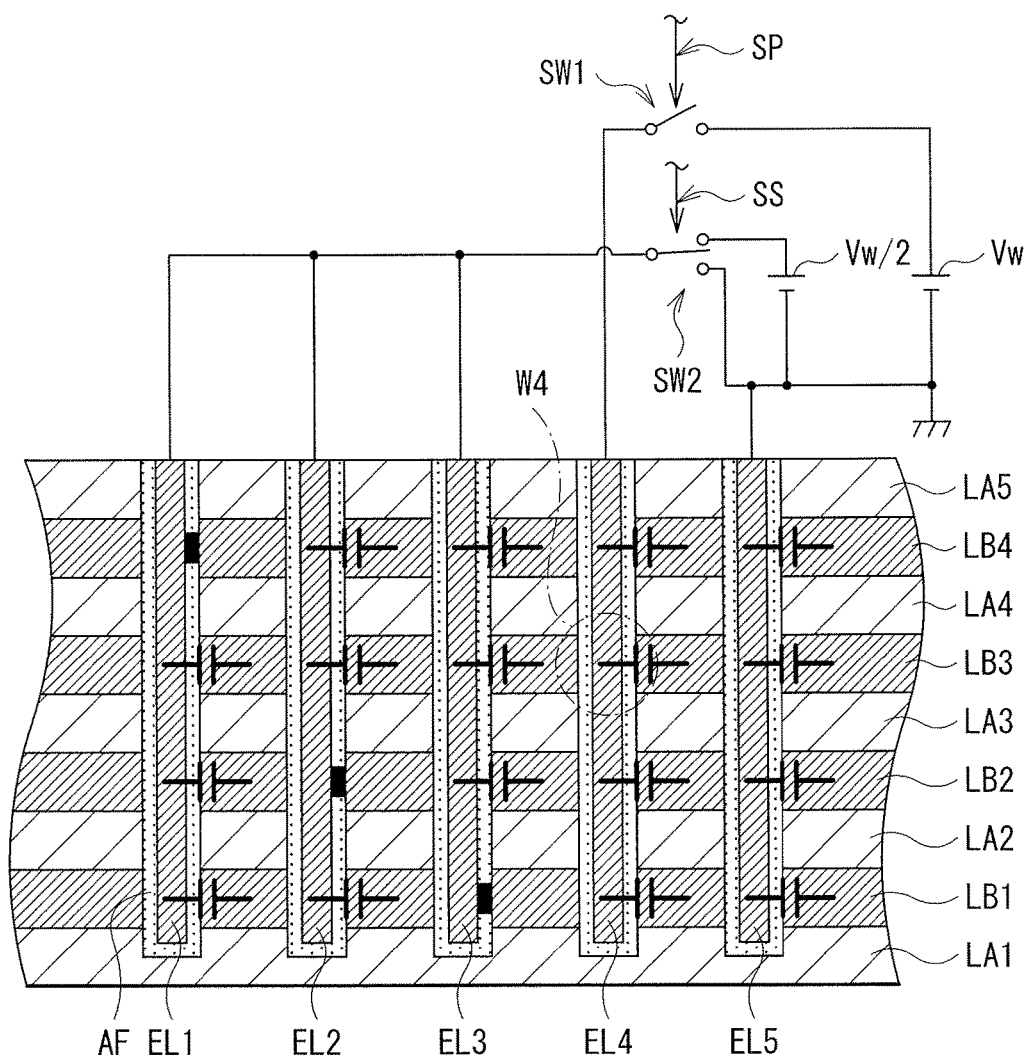
FIG. 21 is an explanatory diagram of signal application to a contact section according to a reference example.

FIG. 21 illustrates a process of coupling the through electrode EL4 to the conductive layer LB3 in the reference example R1 in which four conductive layers LB1 to LB4 and five through electrodes EL1 to EL5 are provided. In other words, the through electrode EL1 has already been electrically coupled to the conductive layer LB4. The through electrode EL2 has already been electrically coupled to the conductive layer LB2. The through electrode EL3 has already been electrically coupled to the conductive layer LB1. In this process, the row decoder 13 grounds the through electrode EL5.

Figure 22:
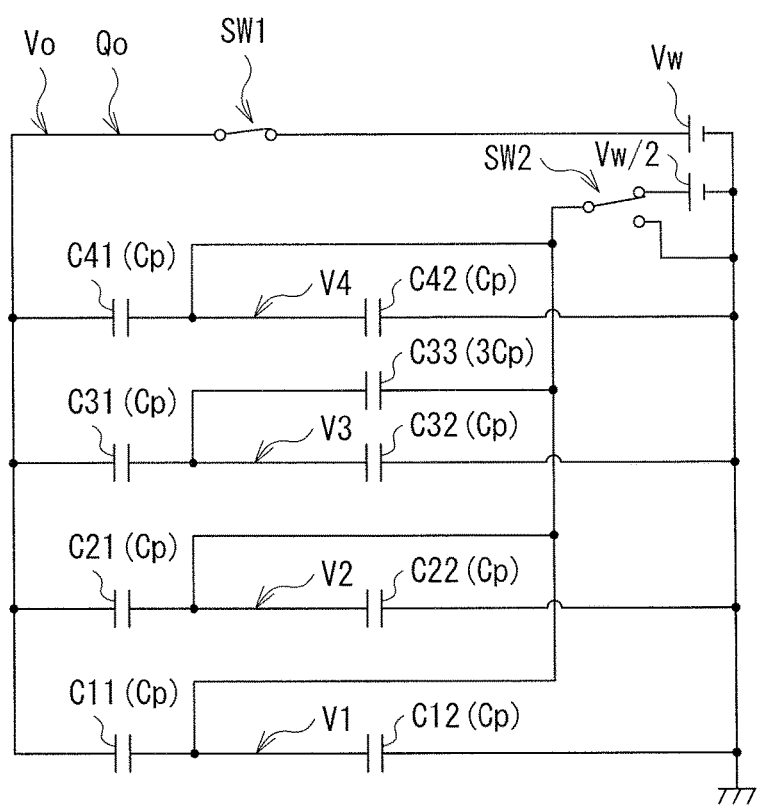
FIG. 22 is an explanatory diagram of a state in the signal application illustrated in FIG. 21.

FIG. 22 illustrates an equivalent circuit of the contact section 12 when precharge is performed on the through electrode EL4. The capacitor C11 corresponds to a parasitic capacitance (the capacitance value Cp1) between the through electrode EL4 and the conductive layer LB1. The capacitor C21 corresponds to a parasitic capacitance (the capacitance value Cp) between the through electrode EL4 and the conductive layer LB2. The capacitor C31 corresponds to a parasitic capacitance (the capacitance value Cp) between the through electrode EL4 and the conductive layer LB3. The capacitor C41 corresponds to a parasitic capacitance (the capacitance value Cp) between the through electrode EL4 and the conductive layer LB4. The capacitor C12 corresponds to a parasitic capacitance (the capacitance value Cp) between the through electrode EL5 and the conductive layer LB1. The capacitor C22 corresponds to a parasitic capacitance (the capacitance value Cp) between the through electrode EL5 and the conductive layer LB2. The capacitor C32 corresponds to a parasitic capacitance (the capacitance value Cp) between the through electrode EL5 and the conductive layer LB3. The capacitor C42 corresponds to a parasitic capacitance (the capacitance value Cp) between the through electrode EL5 and the conductive layer LB4. The capacitor C33 corresponds to a parasitic capacitance (the capacitance value 3Cp) between the through electrodes EL1 to EL3 and the conductive layer LB3.

At this point, the electric charge Qo applied to the through electrode EL4 is 2×Cp×Vw. The voltage V1 in the conductive layer LB1, the voltage V2 in the conductive layer LB2, the voltage V3 in the conductive layer LB3, and the voltage V4 in the conductive layer LB4 are each 1/2×Vw. In other words, the voltages between both ends of the capacitors are insufficient to switch the resistance state of the antifuse film AF from the high resistance state to the low resistance state. In other words, in this process, the through electrode EL4 is not coupled to the conductive layer LB3.

Figure 23:
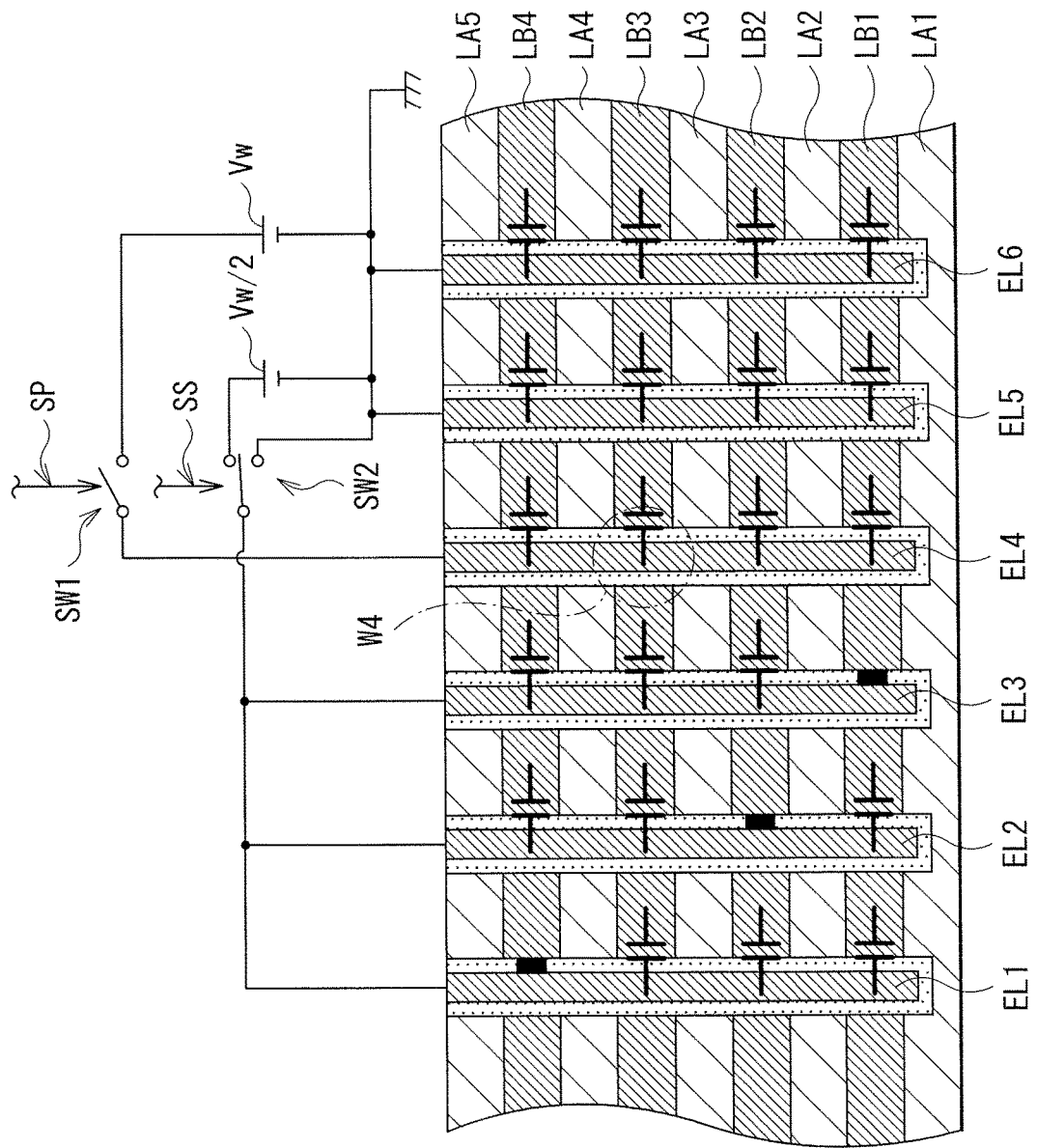
FIG. 23 is an explanatory diagram of signal application to a contact section according to another reference example.

FIG. 23 illustrates a process of coupling the through electrode EL4 to the conductive layer LB3 in the reference example R2 in which four conductive layers LB1 to LB4 and six through electrodes EL1 to EL6 are provided. In this process, the row decoder 13 grounds the through electrodes EL5 and EL6.

Figure 24:
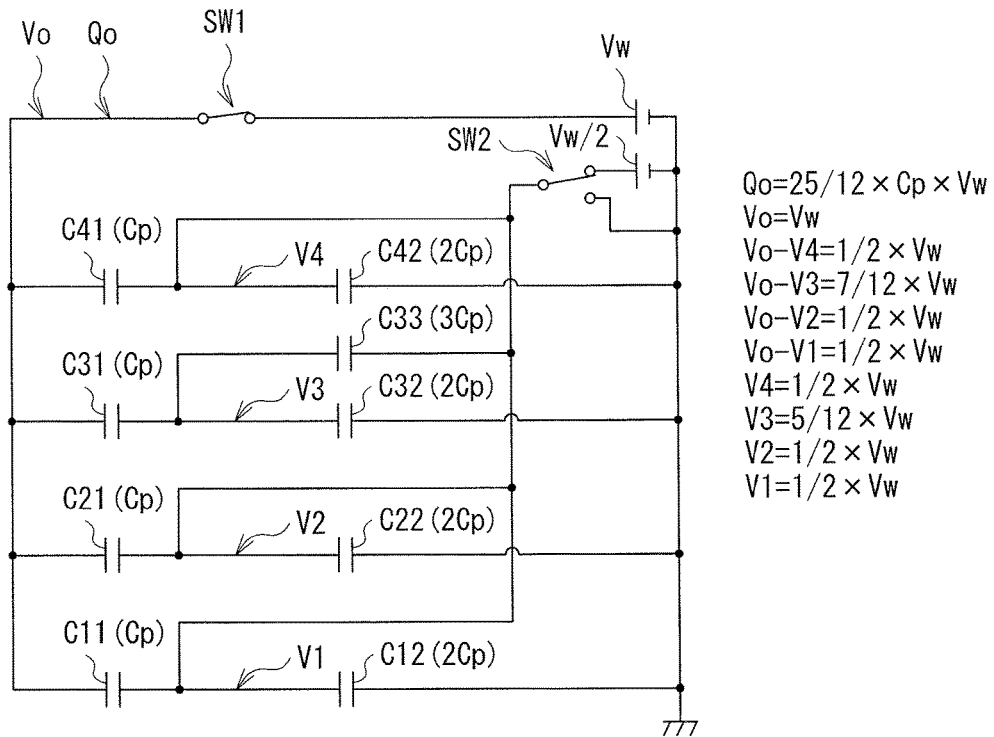
FIG. 24 is an explanatory diagram of a state in the signal application illustrated in FIG. 23.

FIG. 24 illustrates an equivalent circuit of the contact section 12 when precharge is performed on the through electrode EL4. The capacitor C11 corresponds to a parasitic capacitance (the capacitance value Cp) between the through electrode EL4 and the conductive layer LB1. The capacitor C21 corresponds to a parasitic capacitance (the capacitance value Cp) between the through electrode EL4 and the conductive layer LB2. The capacitor C31 corresponds to a parasitic capacitance (the capacitance value Cp) between the through electrode EL4 and the conductive layer LB3. The capacitor C41 corresponds to a parasitic capacitance (the capacitance value Cp) between the through electrode EL4 and the conductive layer LB4. The capacitor C12 corresponds to a parasitic capacitance (the capacitance value 2Cp) between the through electrodes EL5 and EL6 and the conductive layer LB1. The capacitor C22 corresponds to a parasitic capacitance (the capacitance value 2Cp) between the through electrodes EL5 and EL6 and the conductive layer LB2. The capacitor C32 corresponds to a parasitic capacitance (the capacitance value 2Cp) between the through electrodes EL5 and EL6 and the conductive layer LB3. The capacitor C42 corresponds to a parasitic capacitance (the capacitance value 2Cp) between the through electrodes EL5 and EL6 and the conductive layer LB4. The capacitor C33 corresponds to a parasitic capacitance (the capacitance value 3Cp) between the through electrodes EL1 to EL3 and the conductive layer LB3.

At this occasion, the electric charge Qo applied to the through electrode EL4 is 25/12×CpxVw. Moreover, the voltage V3 in the conductive layer LB3 is 5/12×Vw, and the voltage V1 in the conductive layer LB1, the voltage V2 in the conductive layer LB2, and the voltage V4 in the conductive layer LB4 are each 1/2×Vw. In other words, the voltages between both ends of the capacitors excluding the capacitor C31 are insufficient to switch the resistance state of the antifuse film AF from the high resistance state to the low resistance state. The voltage between both ends of the capacitor C31 makes it possible to switch the resistance state of the antifuse film AF from the high resistance state to the low resistance state. Thus, the resistance state of the antifuse film AF between the through electrode EL4 and the conductive layer LB3 is switched from the high resistance state to the low resistance state to electrically couple the through electrode EL4 to the conductive layer LB3.

Figure 25:
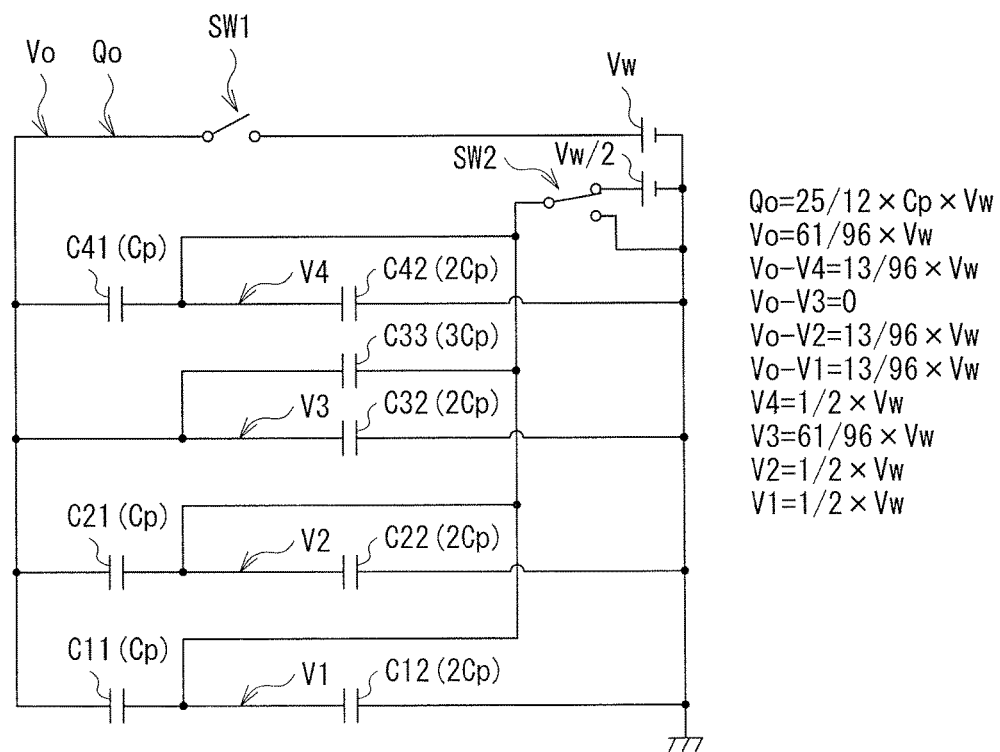
FIG. 25 is an explanatory diagram of another state in the signal application illustrated in FIG. 23.

FIG. 25 illustrates an equivalent circuit of the contact section 12 after the through electrode EL4 and the conductive layer LB3 are electrically coupled to each other. Since the through electrode EL4 and the conductive layer LB3 are electrically coupled to each other as described above, the capacitor C31 in FIG. 24 is deleted. Since the switch SW1 is kept turned off, the electric charge Qo applied to the through electrode EL4 is kept at 25/12×CpxVw, but the voltage Vo is decreased to 61/96×Vw. At this occasion, the voltage between both ends of the capacitor C32 is 61/96×Vw. The voltage of 61/96×Vw makes it possible to switch the resistance state of the antifuse film AF from the high resistance state to the low resistance state. In other words, the stress voltage is supplied to the antifuse film AF between the through electrode EL4 and each of the conductive layers LB5 and LB6, which may cause an error in writing.

In a case where the number of through electrodes EL is small in such a manner, the through electrodes EL and the conductive layers LB may not be properly coupled to each other. As a more general example, a case where N number of conductive layers LB1 to LB(N) and M number of through electrodes EL1 to EL(M) are provided is assumed, and relationship between the N number of conductive layers LB and the M number of the through electrodes EL is studied in order to properly couple the through electrodes EL to the conductive layers LB.

Figure 26:
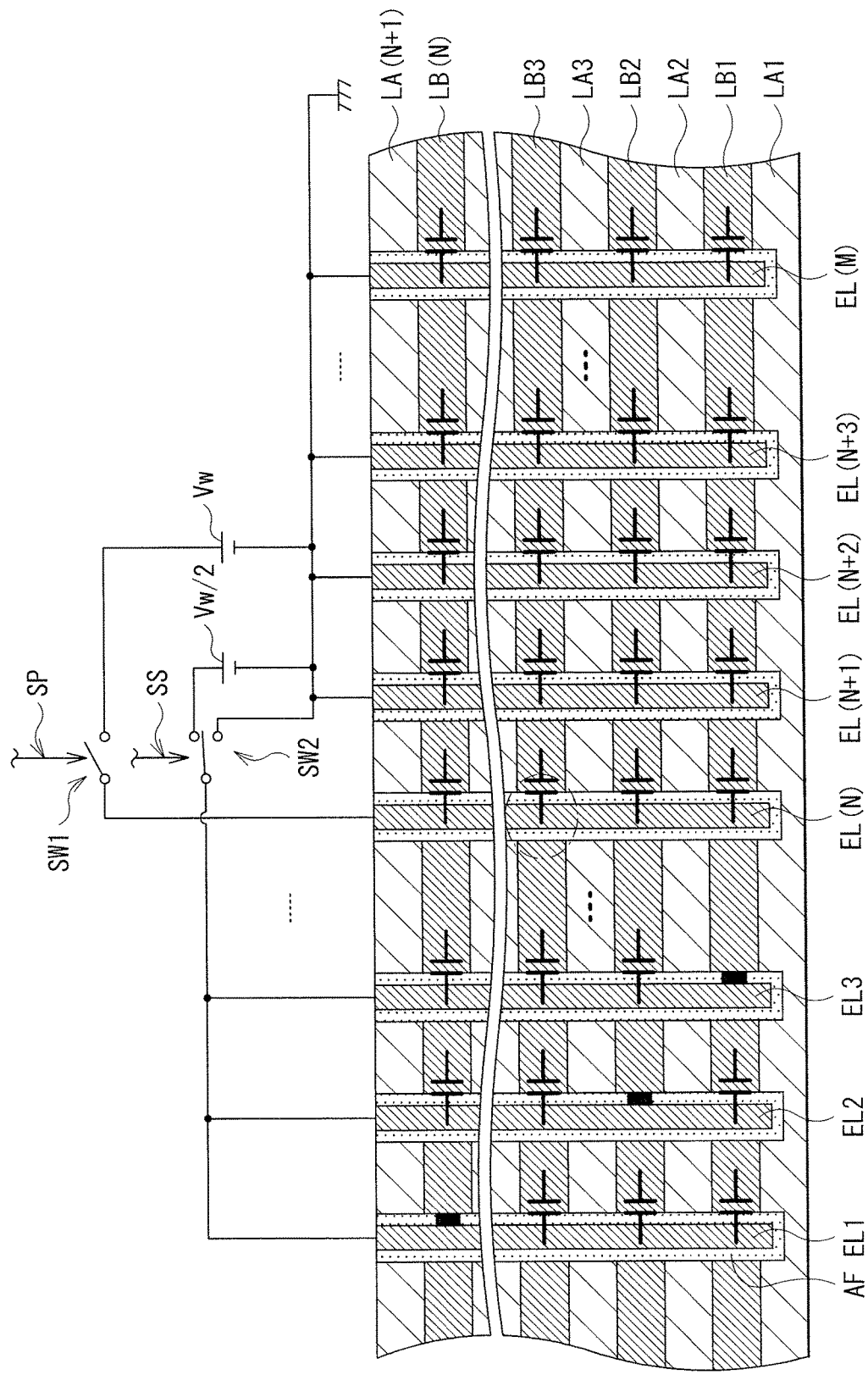
FIG. 26 is an explanatory diagram of signal application to the contact section illustrated in FIG. 3.

FIG. 26 illustrates a process of coupling an Nth through electrode EL(N) to the conductive layer LB3. In other words, at this occasion, the through electrodes EL1 to EL(N×1) has already been coupled to the conductive layers excluding the conductive layer LB3. In this process, the row decoder 13 grounds the through electrodes EL(N+1) to EL(M). Moreover, the row decoder 13 controls the switch SW2 with use of the switching signal SS to apply, to the through electrodes EL1 to EL(N×1), the voltage Vw/2 that is about half of the write voltage Vw. Further, the row decoder 13 turns on the switch SW1 with use of the precharge signal SP to apply the write voltage Vw to the through electrode EL(N).

Figure 27:
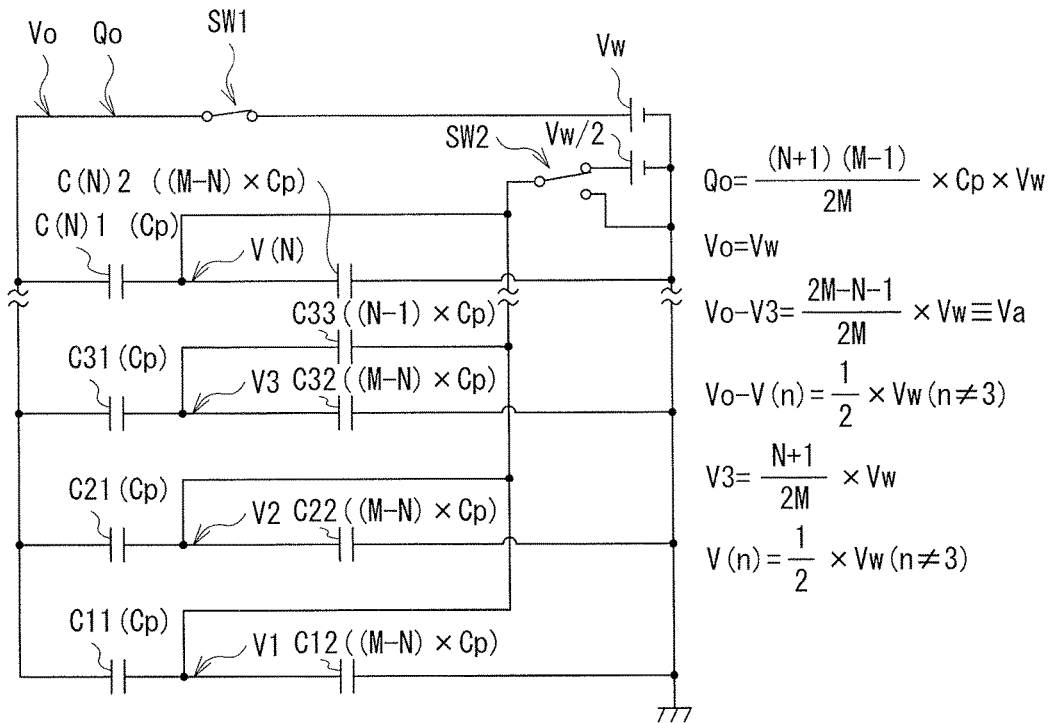
FIG. 27 is an explanatory diagram of a state in the signal application illustrated in FIG. 26.

FIG. 27 illustrates an equivalent circuit of the contact section 12 when precharge is performed on the through electrode EL(N). The capacitor C11 corresponds to a parasitic capacitance (the capacitance value Cp) between the through electrode EL(N) and the conductive layer LB1. The capacitor C21 corresponds to a parasitic capacitance (the capacitance value Cp) between the through electrode EL(N) and the conductive layer LB2. The capacitor C31 corresponds to a parasitic capacitance (the capacitance value Cp) between the through electrode EL(N) and the conductive layer LB3. A capacitor C(N)1 corresponds to a parasitic capacitance (the capacitance value Cp) between the through electrode EL(N) and the conductive layer LB(N). The capacitor C12 corresponds to a parasitic capacitance (a capacitance value (M−N)×Cp) between the through electrodes EL(N+1) to EL(M) and the conductive layer LB1. The capacitor C22 corresponds to a parasitic capacitance (the capacitance value (M−N)×Cp) between the through electrodes EL(N+1) to EL(M) and the conductive layer LB2. The capacitor C32 corresponds to a parasitic capacitance (the capacitance value (M−N)×Cp) between the through electrodes EL(N+1) to EL(M) and the conductive layer LB3. A capacitor C(N)2 corresponds to a parasitic capacitance (the capacitance value (M−N)×Cp) between the through electrodes EL(N+1) to EL(M) and the conductive layer LB(N). The capacitor C33 corresponds to a parasitic capacitance (the capacitance value (N−1)×Cp) between the through electrodes EL1 to EL(N−1) and the conductive layer LB3.

At this occasion, the electric charge Qo illustrated in FIG. 27 is applied to the through electrode EL(N). The voltage V3 in the conductive layer LB3 is (N+1)/(2M)×Vw, voltages V(n) (where n is not equal to 3) in other conductive layers are each 1/2×Vw. Moreover, a voltage difference Vo-V3 between the voltage Vo and the voltage V3 in the through electrode EL(N) to which the write voltage Vw is applied is (2M−N−1)/(2M)×Vw. Hereinafter, the voltage difference is referred to as "voltage Va". In order to couple the through electrode EL(N) to the conductive layer LB3, it is necessary that the voltage Va makes it possible to switch the resistance state of the antifuse film AF from the high resistance state to the low resistance state.

Figure 28:
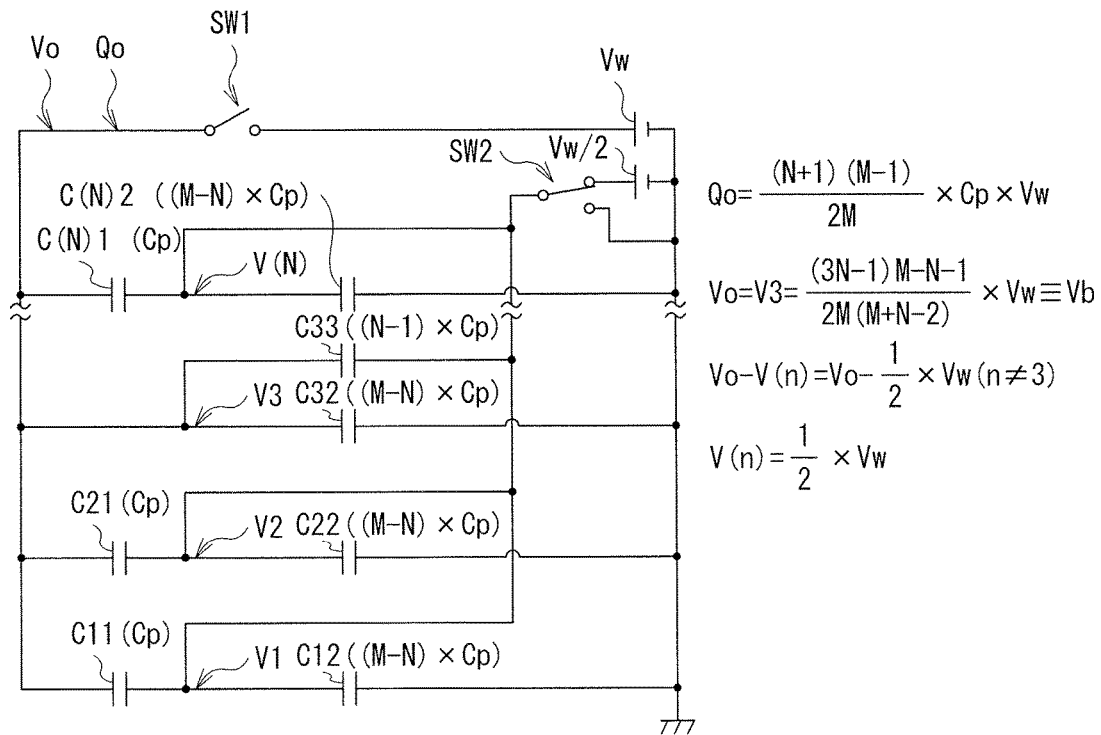
FIG. 28 is an explanatory diagram of another state in the signal application illustrated in FIG. 26.

FIG. 28 illustrates an equivalent circuit of the contact section 12 after the through electrode EL(N) is electrically coupled to the conductive layer LB3. The voltage Vo is decreased to ((3N−1)*M−N−1)/(2M*(M+N−2))*Vw. Hereinafter, the voltage Vo is referred to as "voltage Vb". In order to avoid an error in writing, it is necessary that the voltage Vb does not switch the resistance state of the antifuse film AF from the high resistance state to the low resistance state.

The voltage Va is a voltage that makes is possible to switch the resistance state of the antifuse film AF from the high resistance state to the low resistance state, and the voltage Vb is a voltage that does not switch the resistance state of the antifuse film AF from the high resistance state to the low resistance state. Accordingly, the voltage Va is higher than the voltage Vb (Va>Vb). In order to satisfy this condition, it is necessary that the N number of conductive layers LB and the M number of through electrodes EL satisfy relationship represented by the following expression.

[Math. 1]

$$M > \frac{1+\sqrt{3}}{2} \times N + 1 \qquad (1)$$

In other words, about a number obtained by "1.37×N+1" or more of through electrodes EL may be necessary as the M number of through electrodes EL. In a case where the N number of conductive layers LB is four (N=4), the M number of through electrodes EL may be seven or more (M>=7). In a case where the N number is large enough, the second term on the right side is negligible; therefore, about a number obtained by "1.37*N" or more of through electrodes EL may be necessary as the M number of through electrodes EL.

In the storage device 1, the M number of through electrodes EL and the N number of conductive layers LB are set so as to satisfy the expression (1), which makes it possible to properly couple the through electrodes EL to the conductive layers LB.

(Effects)

As described above, in the embodiment, the through electrodes are formed so as to penetrate the insulating layers and the conductive layers that are stacked, and the antifuse films are formed so as to cover the through electrodes. This makes it possible to reduce the area of the storage device.

In embodiments of the present disclosure, a stress voltage is applied to the antifuse films to electrically couple the through electrodes to the conductive layers. This makes it possible to reduce the number of manufacturing processes, thereby reducing manufacturing cost.

Modification Example 1

In the foregoing embodiment, four of eight through electrodes EL are coupled to the conductive layers LB; however, embodiments of the present disclosure are not limited thereto, and the remaining four through electrodes EL may be also coupled to the conductive layers LB. Such a modification example is described in detail below.

Figure 29:
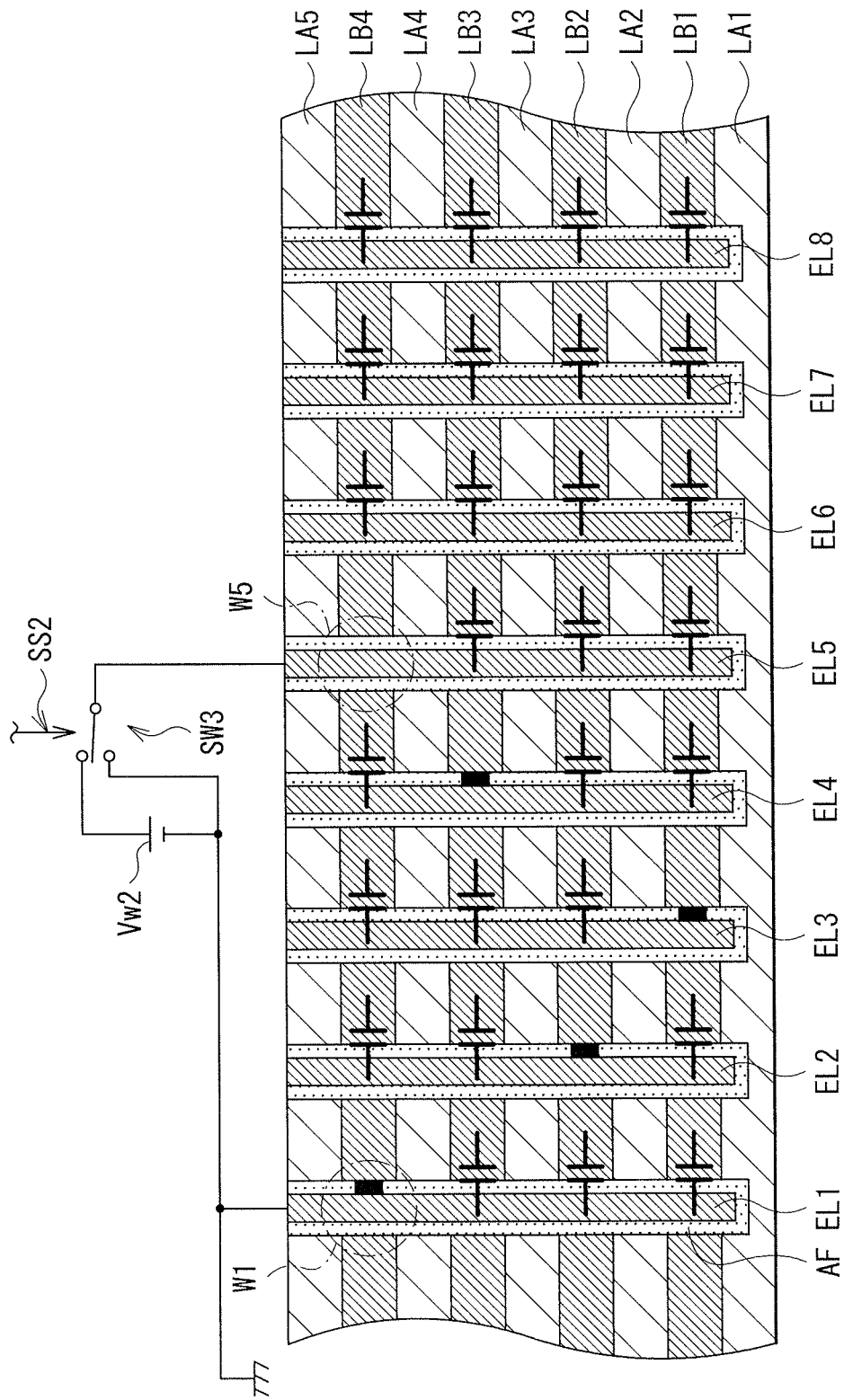
FIG. 29 is an explanatory diagram of signal application according to a modification example.

FIG. 29 illustrates a process of coupling the through electrode EL5 to the conductive layer coupled to the through electrode EL1 (the conductive layer LB4 in this example). In this process, the row decoder 13 grounds the through electrode EL1, thereby grounding the conductive layer LB4 through the through electrode EL1. Further, the row decoder 13 controls a switch SW3 with use of a switching signal SS2 to apply a voltage Vw2 to the through electrode EL5. Setting the voltage Vw2 to a sufficiently high voltage makes it possible to switch the resistance state of a portion of the antifuse film AF between the through electrode EL5 and the conductive layer LB4 (part W5) from the high resistance state to the low resistance state. This makes it possible to further decrease a resistance value in the portion of the antifuse film AF between the through electrode EL1 and the conductive layer LB4 (the part W1).

In order to couple the through electrode EL6 to the conductive layer coupled to the through electrode EL2 (the conductive layer LB2 in this example) in a similar manner, the through electrode EL2 is grounded, and the voltage Vw2 is applied to the through electrode EL6. Moreover, in order to couple the through electrode EL7 to the conductive layer coupled to the through electrode EL3 (the conductive layer LB1 in this example), the through electrode EL3 is grounded, and the voltage Vw2 is applied to the through electrode EL7. Further, in order to couple the through electrode EL8 to the conductive layer coupled to the through electrode EL4 (the conductive layer LB3 in this example), the through electrode EL4 is grounded, and the voltage Vw2 is applied to the through electrode EL8.

Figure 30:
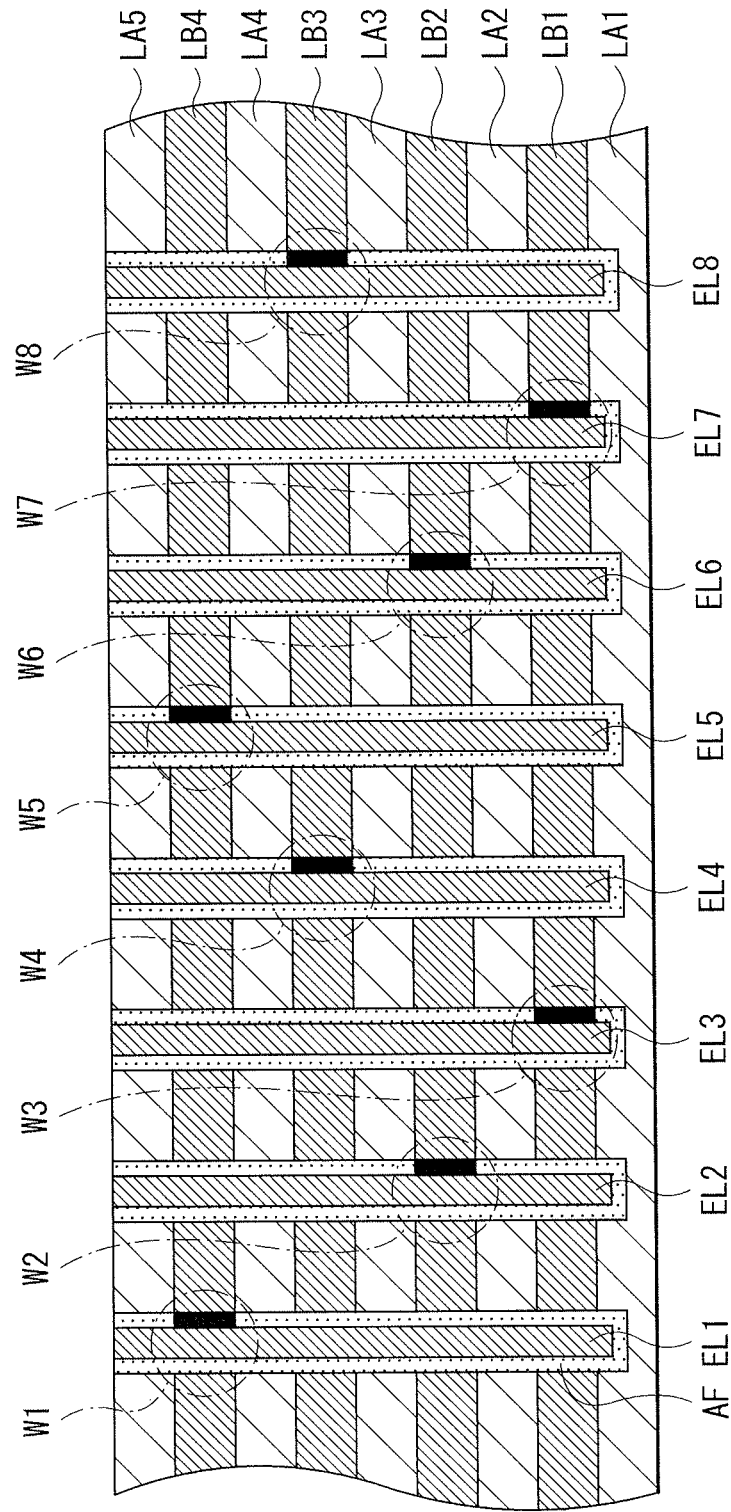
FIG. 30 is a sectional view of a configuration example of a contact section according to a modification example.

FIG. 30 illustrates an example of the contact section 12 after such a process is performed. In this example, the through electrodes EL1 and EL5 are electrically coupled to the conductive layer LB4, the through electrodes EL2 and EL6 are electrically coupled to the conductive layer LB2, the through electrodes EL3 and EL7 are electrically coupled to the conductive layer LB1, and the through electrodes EL4 and EL8 are electrically coupled to the conductive layer LB3.

With this configuration, during operation of the storage device 1, the row decoder 13 is allowed to supply a signal to the conductive layer LB4 through two through electrodes EL1 and EL5, to supply a signal to the conductive layer LB2 through two through electrodes EL2 and EL6, to supply a signal to the conductive layer LB1 through two through electrodes EL3 and EL7, and to supply a signal to the conductive layer LB3 through two through electrodes EL4 and EL8. In other words, the row decoder 13 is coupled to the array section 11 at a lower impedance. This makes it possible to easily drive the array section 11.

Modification Example 2

In the foregoing embodiment, as illustrated in FIGS. 9 and 10 and other figures, the voltage is applied to the through electrodes EL with use of the switching signal SS and the precharge signal SP; however, embodiments of the present disclosure are not limited thereto. A modification example is described in detail below.

Figure 31:
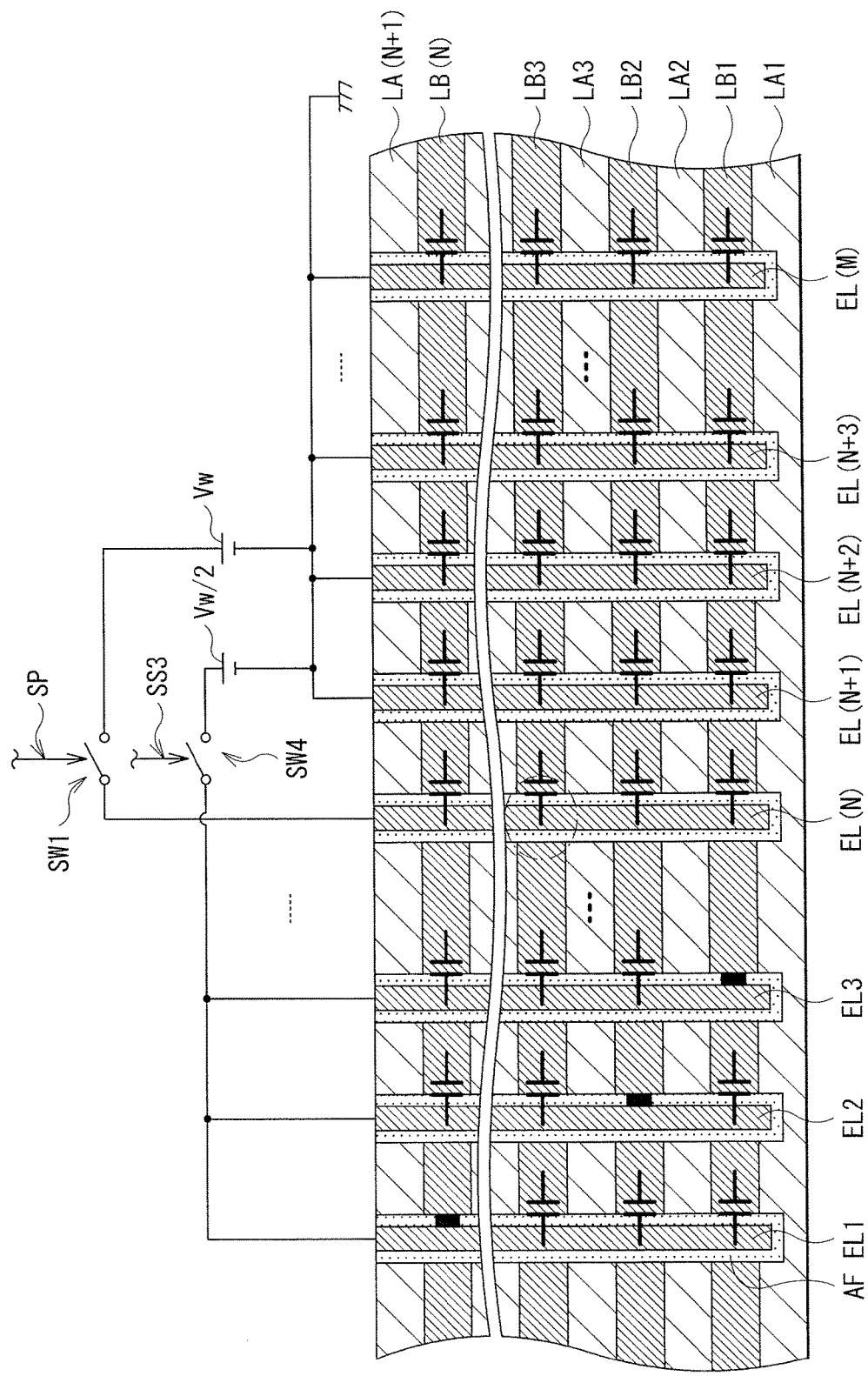
FIG. 31 is an explanatory diagram of signal application according to a modification example.

FIG. 31 illustrates a process of coupling the Nth through electrode EL(N) to the conductive layer LB3. In this example, the through electrodes EL1 to EL(N−1) have been already coupled to the conductive layers LB1, LB2, and LB4 to LB(N). In this process, the row decoder 13 grounds the through electrodes EL(N+1) to EL(M). Moreover, the row decoder 13 turns on a switch SW4 with use of a switching signal SS3 to apply, to the through electrodes EL1 to EL(N−1), the voltage Vw/2 that is about half of the write voltage Vw. Further, the row decoder 13 turns on the switch SW1 with use of the precharge signal SP to apply the write voltage Vw to the through electrode EL(N).

Figure 32:
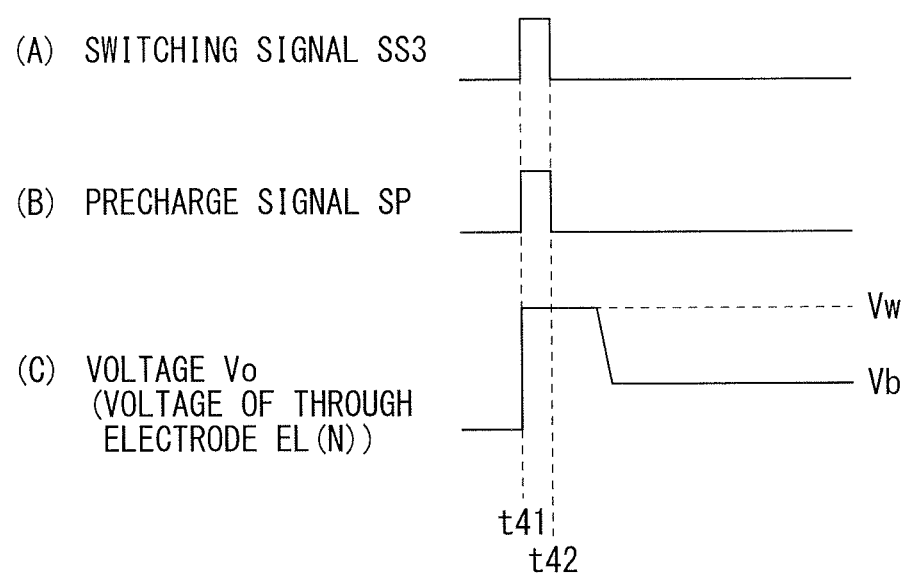
FIG. 32 is a timing waveform chart of the signal application illustrated in FIG. 31.

FIG. 32 illustrates signal application in this process, where (A) indicates a waveform of the switching signal SS3, (B) indicates a waveform of the precharge signal SP, and (C) indicates a waveform of the voltage Vo in the through electrode to which the write voltage Vw is applied (the through electrode EL(N) in this example).

First, the row decoder 13 switches the switching signal SS3 from the low level to the high level at a timing t41 (see (A) of FIG. 32). Accordingly, the switch SW4 is turned on, and the voltage Vw/2 is applied to the through electrodes EL1 to EL(N−1). Concurrently with this, the row decoder 13 switches the precharge signal SP from the low level to the high level (see (B) of FIG. 32). The switch SW1 is thereby turned on to switch the voltage Vo of the through electrode EL(N) to the write voltage Vw (see (C) of FIG. 32). Thereafter, the row decoder 13 performs precharge in a period from the timing t41 to a timing t42.

Figure 33:
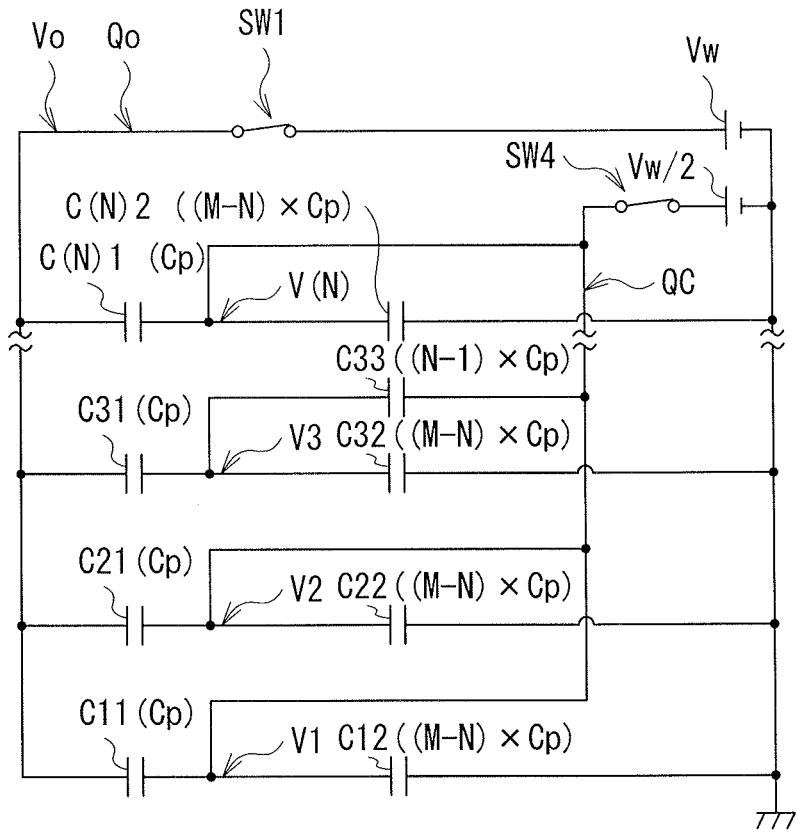
FIG. 33 is an explanatory diagram of a state in the signal application illustrated in FIG. 32.

FIG. 33 illustrates an equivalent circuit of the contact section 12 when precharge is performed on the through electrode EL(N). Each of the capacitors is similar to that in the foregoing embodiment (see FIG. 27). The electric charge Qc illustrated in FIG. 33 is applied to the through electrodes EL1 to EL(N−1). A voltage of each node is similar to that in the foregoing embodiment (see FIG. 27). In order to couple the through electrode EL(N) to the conductive layer LB3, it is necessary that the voltage Va (=Vo−V3) makes it possible to switch the resistance state of the antifuse film AF from the high resistance state to the low resistance state.

Figure 34:
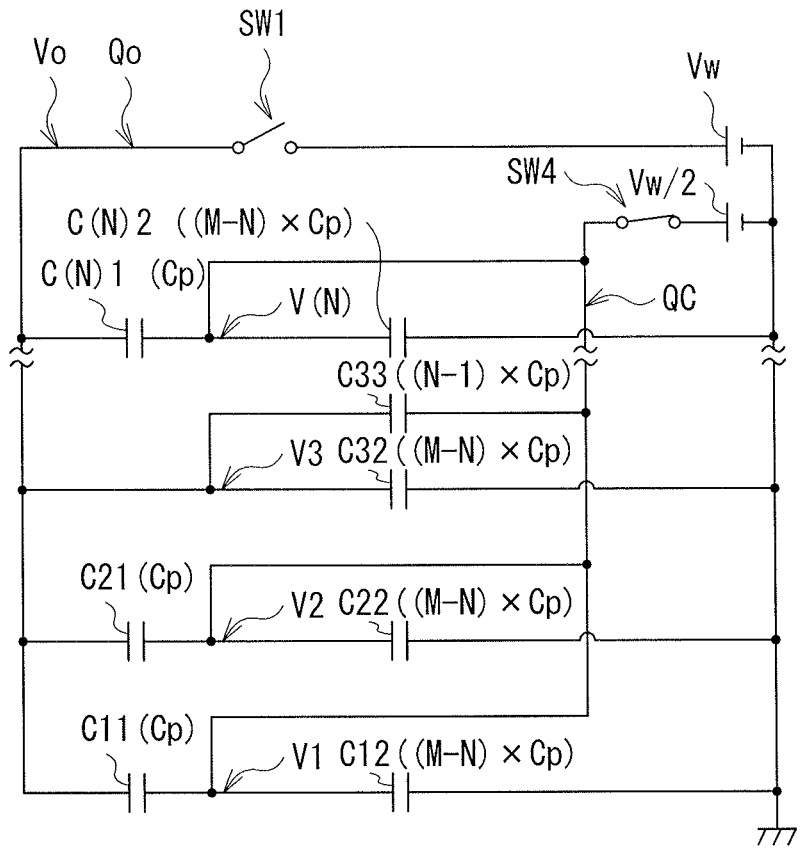
FIG. 34 is an explanatory diagram of another state in the signal application illustrated in FIG. 32.

FIG. 34 illustrates an equivalent circuit of the contact section 12 after the through electrode EL(N) and the conductive layer LB3 are electrically coupled to each other. Since, in this example, the switch SW4 is off, unlike the case of the foregoing embodiment (see FIG. 28), electric charge Qc applied to the through electrodes EL1 to EL(N−1) is maintained. Thereafter, the voltage Vo is decreased to a voltage represented by an expression illustrated in FIG. 34. Hereinafter, the voltage Vo is referred to as "voltage Vb". In order to avoid an error in writing, it is necessary that the voltage Vb does not switch the resistance state of the antifuse film AF from the high resistance state to the low resistance state.

In order to make the voltage Va larger than the voltage Vb (Va>Vb), it is necessary that the N number of conductive layers LB and the M number of through electrodes EL satisfy the following expression.

[Math. 2]

$$M > \frac{1+\sqrt{3}}{2} \times N + \frac{\sqrt{3}}{3} \quad (2)$$

In other words, about a number obtained by "1.37×N+ 0.58" or more of through electrodes EL may be necessary as the M number of through electrodes EL. In other words, the condition of the M number may be slightly relaxed, in comparison with the foregoing embodiment (the expression (1)).

Modification Example 3

In the foregoing embodiment, the technology is applied to NAND flash memory; however, embodiments of the present disclosure are not limited thereto. Alternatively, the technology may be applied to, for example, a storage device using a resistive switching element. Such a modification example is described in detail below.

Figure 35:
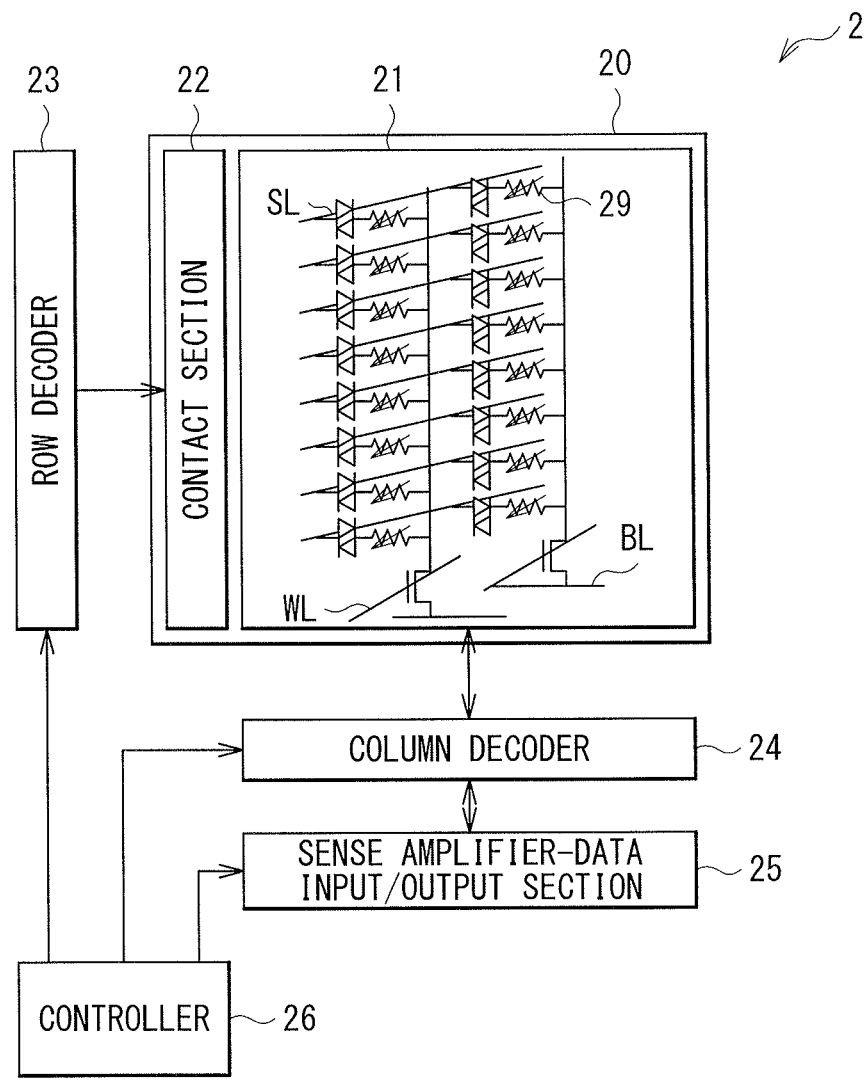
FIG. 35 is a block diagram of a configuration example of a storage device according to a modification example.

FIG. 35 illustrates a configuration example of a storage device 2 according to the modification example. The storage device 2 may include a memory cell array 20, a row decoder 23, a column decoder 24, a sense amplifier-data input/output section 25, and a controller 26.

The memory cell array 20 may include an array section 21 and a contact section 22. The array section 21 may include a plurality of memory elements 29, a plurality of source lines SL, a plurality of word lines WL, and a plurality of bit lines BL. The memory elements 29 are resistive switching elements. The plurality of source lines SL are coupled to the row decoder 23 through the contact section 22. The plurality of word lines WL and the plurality of bit lines BL are coupled to the column decoder 24. The contact section 22 is adapted to function as a contact for coupling of the row decoder 23 to the source lines SL of the array section 21.

The row decoder 23 is adapted to decode a row address signal supplied from the controller 26 and supply the thus-decoded signal to the array section 21 of the memory cell array 20. The row decoder 23 is coupled to the source lines SL of the array section 21 through the through electrodes EL of the contact section 22 of the memory cell array 20. The row decoder 23 also has a function of supplying a signal to the through electrodes EL in a process of manufacturing the storage device 2 to electrically couple the through electrodes EL to the conductive layers LB.

The column decoder 24 is adapted to decode a column address signal supplied from the controller 26 and supply the thus-decoded signal to the array section 21 of the memory cell array 20. The column decoder 24 also has a function of writing, on the array section 21, data supplied from the sense amplifier-data input/output section 25 or supplying, to the sense amplifier-data input/output section 25, data read from the array section 21. The column decoder 24 is coupled to the word lines WL and the bit lines BL in the array section 21.

The sense amplifier-data input/output section 25 is adapted to amplify the data supplied from the column decoder 24. The sense amplifier-data input/output section 25 also has a function of exchanging data with outside.

The controller 26 is adapted to control operation of the row decoder 23, the column decoder 24, and the sense amplifier-data input/output section 25.

Although the technology has been described above with reference to the example embodiment and the modification examples, the technology is not limited thereto, and may be modified in a variety of ways.

In the foregoing embodiment, the technology is applied to, for example but not limited to, the storage device. The technology is applicable to various semiconductor devices including a plurality of conductive layers and a plurality of insulating layers that are alternately stacked.

Note that the effects described in the present specification are illustrative and non-limiting. Effects achieved by the technology may be effects other than those described above.

It is to be noted that the contents of the technology may have the following configurations.

(1) A semiconductor device including:
a plurality of conductive layers and a plurality of insulating layers, the conductive layers and the insulating layers being alternately stacked over a first region and a second region, the second region being adapted for electrical coupling to the first region;
a plurality of through electrodes penetrating the conductive layers and the insulating layers in the second region; and
antifuses each provided between corresponding one of the through electrodes and corresponding one of the conductive layers.

(2) The semiconductor device according to (1), wherein each one of the through electrodes is electrically coupled to corresponding one of the conductive layers through corresponding one of the antifuses provided between the one of the through electrodes and the corresponding one of the conductive layers.

(3) The semiconductor device according to (1) or (2), wherein
the through electrodes each correspond to any one of the conductive layers,
each of the antifuses provided between the through electrodes and the conductive layers corresponding to each other has low resistance, and
each of the antifuses provided between the through electrodes and the conductive layers non-corresponding to each other has high resistance.

(4) The semiconductor device according to any one of (1) to (3), wherein
a first through electrode of the through electrodes is electrically coupled to a first conductive layer of the conductive layers through one of the antifuses provided between the first through electrode and the first conductive layer, and
a second through electrode of the through electrodes is electrically coupled to the first conductive layer through another one of the antifuses provided between the second through electrode and the first conductive layer.

(5) The semiconductor device according to any one of (1) to (4), wherein the number of the through electrodes is greater than the number of the conductive layers.

(6) The semiconductor device according to (5), wherein the number of the through electrodes is 1.37 times or greater than 1.37 times the number of the through electrodes.

(7) The semiconductor device according to any one of (1) to (6), further including a memory array provided in the first region.

(8) A method of manufacturing a semiconductor device including:
selecting a first through electrode from a plurality of through electrodes, the through electrodes penetrating a plurality of conductive layers and a plurality of insulating layers that are alternately stacked, wherein antifuses are each provided between corresponding one of the through electrodes and corresponding one of the conductive layers; and
applying a first voltage and a second voltage, the first voltage being applied to one or more of the through electrodes excluding the first electrode, and the second voltage being applied to the first through electrode.

(9) The method of manufacturing the semiconductor device according to (8), further including causing the first through electrode to be electrically floated after the second voltage is applied to the first through electrode.

(10) The method of manufacturing the semiconductor device according to (8) or (9), further including:
selecting a second through electrode from the through electrodes excluding the first through electrode; and
applying the first voltage, the second voltage, and a third voltage, the first voltage being applied to the through electrodes excluding the first through electrode and the second through electrode, the second voltage being applied to the second through electrode, and the third voltage being applied to the first through electrode and being between the first voltage and the second voltage.

(11) The method of manufacturing the second device according to (10), further including causing the second through electrode to be electrically floated after the second voltage is applied to the second through electrode.

(12) The method of manufacturing the semiconductor device according to (11), wherein the applying of the third voltage to the first through electrode is continued when the second through electrode is electrically floated.

(13) The method of manufacturing the semiconductor device according to (11), further including causing the first through electrode to be electrically floated when the second through electrode is electrically floated.

(14) The method of manufacturing the semiconductor device according to any one of (10) to (13), wherein
the first voltage is a ground voltage, and
the third voltage is about half of the second voltage.

(15) The method of manufacturing the semiconductor device according to any one of (8) to (14), further including:
selecting a third through electrode from unselected through electrodes of the through electrodes; and
applying the first voltage and a fourth voltage, the first voltage being applied to the first through electrode, and the fourth voltage being applied to the third through electrode.

(16) A semiconductor device, comprising:
a plurality of insulating layers;
a plurality of conductive layers, wherein the insulating layers and the conductive layers are alternately stacked;
a plurality of through electrodes, wherein each of the through electrodes penetrates the conductive layers, wherein at least some of the through electrodes are electrically connected to one of the conductive layers, and wherein different conductive layers are connected to different through electrodes.

(17) The semiconductor device of (16), further comprising:
a plurality of antifuse films, wherein an antifuse film is between each of the through electrodes and the conductive layers.

(18) The semiconductor device of (17), wherein for each of the at least some of the through electrodes electrically connected to one of the conductive layers a portion of an antifuse film between the through electrode and the conductive layer electrically connected to the through electrode is in a low resistance state.

(19) The semiconductor device of (17), wherein the antifuse films are formed of a material that switches from a high resistance state to a low resistance state by application of a stress voltage.

(20) The semiconductor device of (17), wherein the antifuse film is between each of the through electrodes and the insulating layers.

(21) The semiconductor device of (17), wherein the antifuse film is not present between the through electrodes and at least portions of the insulating layers.

(22) The semiconductor device of (16), further comprising:
a contact section; and
a memory cell array, wherein the through electrodes are located within the contact section, and wherein the conductive layers and the insulating layers extend from the contact section to the memory cell array.

(23) The semiconductor device of (22), wherein the memory cell array is a NAND flash memory array.

(24) The semiconductor device of (22), wherein the conductive layers are word lines.

(25) The semiconductor device of (16), wherein each of the conductive layers is electrically connected to a plurality of through electrodes.

(26) The semiconductor device of (16), wherein the number of through electrodes is greater than the number of conductive layers.

(27) The semiconductor device of (16), wherein the number of conductive layers is equal to N, wherein the number of through electrodes is equal to M, and wherein the expression $M>(1+\sqrt{3})/2 \times N=1$ is satisfied.

(28) The semiconductor device of (16), wherein the number of conductive layers is equal to N, wherein the number of through electrodes is equal to M, and wherein the expression $M>(1+\sqrt{3})/2 \times N+(\sqrt{3})/3=1$ is satisfied.

(29) The semiconductor device of (17), wherein the antifuses are formed from at least one of silicon oxide, silicon nitride, hafnium oxide, titanium oxide tantalum oxide.

(30) A method of forming a semiconductor structure, comprising:
providing a plurality of conductive layers;
providing a plurality of insulating layers, wherein the conductive layers are alternately stacked with the insulating layers;
providing a plurality of through electrodes, wherein the through electrodes penetrate the plurality of conductive layers and the plurality of insulating layers;
providing a plurality of antifuses, wherein each of the through electrodes is separated from each of the conductive layers by an antifuse; and
applying at least a first voltage to a first through electrode included in the plurality of through electrodes while applying less than a second voltage to the other electrodes included in the plurality of through electrodes, wherein the first voltage is greater than the second voltage.

(31) The method of (30), further comprising:
after applying the at least a first voltage to the first through electrode, electrically floating the first through electrode.

(32) The method of (31), further comprising:
applying at least the first voltage to a second through electrode included in the plurality of through electrodes;
applying less than the second voltage to the through electrodes not including the first and second through electrodes;
applying a third voltage to the first through electrode, wherein the third voltage is greater than the second voltage and less than the first voltage.

(33) The method of (32), further comprising:
after applying the at least a first voltage to the second through electrode, continuing to apply the third voltage to the first through electrode while electrically floating the second through electrode.

(34) The method of (33), wherein the first through electrode is electrically connected to one of the conductive layers, and wherein the second through electrode is electrically connected to another one of the conductive layers.

(35) An electronic apparatus, comprising:
a memory cell array, including:
a plurality of insulating layers;
a plurality of conductive layers, wherein each of the insulating layers and the conductive layers are alternately stacked;
a plurality of through electrodes, wherein each of the through electrodes penetrates the conductive layers, and wherein at least some of the through electrodes are electrically connected to one of the conductive layers;
a row decoder, wherein the row decoder is electrically connected to the through electrodes in a contact section of the memory cell array.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1, 2 storage device
10, 20 memory cell array
11, 21 array section
12, 22 contact section
13, 23 row decoder
14, 24 column decoder
15, 25 sense amplifier-data input/output section
16, 26 controller
19, 29 memory element
AF antifuse film
BL bit line
Cp capacitance value
C11 to C13, C21 to C23, C31 to C33, C41 to C43, ..., C(N)1, C(N)2 capacitor
EL, EL1 to EL8, ..., EL(N), EL(N+1), EL(N+2), EL(N+3), ..., EL(M) through electrode
HL hole
LA, LA1 to LA5, ..., LA(N+1) insulating layer
LB, LB1 to LB4, LB(N) conductive layer
Qo, Qc electric charge
SL source line
SP precharge signal
SS, SS2, SS3 switching signal
SW1, SW2, SW3, SW4 switch
Vw write voltage
Vo, V1 to V4, ..., V(N), V(n) voltage
WL word line

What is claimed is:

1. A method of manufacturing a semiconductor device comprising:
selecting a first through electrode from a plurality of through electrodes, the through electrodes penetrating a plurality of conductive layers and a plurality of insulating layers that are alternately stacked, wherein
antifuses are each provided between corresponding ones of the through electrodes and corresponding ones of the conductive layers;
applying a first voltage and a second voltage, the first voltage being applied to one or more of the through electrodes excluding the first electrode, and the second voltage being applied to the first through electrode; and
causing the first through electrode to be electrically floated after the second voltage is applied to the first through electrode.

2. The method of manufacturing the semiconductor device according to claim 1, wherein each one of the through electrodes is electrically coupled to corresponding ones of the conductive layers through corresponding ones of the antifuses provided between the ones of the through electrodes and the corresponding ones of the conductive layers.

3. The method of manufacturing the semiconductor device according to claim 1, wherein
the through electrodes each correspond to any one of the conductive layers,
each of the antifuses provided between the through electrodes and the conductive layers corresponding to each other has a low resistance, and
each of the antifuses provided between the through electrodes and the conductive layers non-corresponding to each other has a high resistance.

4. The method of manufacturing the semiconductor device according to claim 1, wherein
a first through electrode of the through electrodes is electrically coupled to a first conductive layer of the conductive layers through one of the antifuses provided between the first through electrode and the first conductive layer, and
a second through electrode of the through electrodes is electrically coupled to the first conductive layer through another one of the antifuses provided between the second through electrode and the first conductive layer.

5. The method of manufacturing the semiconductor device according to claim 1, wherein the number of the through electrodes is greater than the number of the conductive layers.

6. The method of manufacturing the semiconductor device according to claim 1, wherein the number of the through electrodes is 1.37 times or greater than 1.37 times the number of the conductive layers.

7. A method of manufacturing a semiconductor device comprising:
selecting a first through electrode from a plurality of through electrodes, the through electrodes penetrating a plurality of conductive layers and a plurality of insulating layers that are alternately stacked, wherein
antifuses are each provided between corresponding ones of the through electrodes and corresponding ones of the conductive layers;
applying a first voltage and a second voltage, the first voltage being applied to one or more of the through electrodes excluding the first electrode, and the second voltage being applied to the first through electrode;

selecting a second through electrode from the through electrodes excluding the first through electrode; and applying the first voltage, the second voltage, and a third voltage, the first voltage being applied to the through electrodes excluding the first through electrode and the second through electrode, the second voltage being applied to the second through electrode, and the third voltage being applied to the first through electrode and being between the first voltage and the second voltage.

8. The method of manufacturing the second device according to claim 7, further comprising causing the second through electrode to be electrically floated after the second voltage is applied to the second through electrode.

9. The method of manufacturing the semiconductor device according to claim 8, wherein the applying of the third voltage to the first through electrode is continued when the second through electrode is electrically floated.

10. The method of manufacturing the semiconductor device according to claim 8, further comprising causing the first through electrode to be electrically floated when the second through electrode is electrically floated.

11. The method of manufacturing the semiconductor device according to claim 7, wherein
the first voltage is a ground voltage, and
the third voltage is about half of the first voltage.

12. The method of manufacturing the semiconductor device according to claim 7, wherein each one of the through electrodes is electrically coupled to corresponding ones of the conductive layers through corresponding ones of the antifuses provided between the ones of the through electrodes and the corresponding ones of the conductive layers.

13. The method of manufacturing the semiconductor device according to claim 7, wherein
the through electrodes each correspond to any one of the conductive layers,
each of the antifuses provided between the through electrodes and the conductive layers corresponding to each other has a low resistance, and
each of the antifuses provided between the through electrodes and the conductive layers non-corresponding to each other has a high resistance.

14. The method of manufacturing the semiconductor device according to claim 7, wherein
a first through electrode of the through electrodes is electrically coupled to a first conductive layer of the conductive layers through one of the antifuses provided between the first through electrode and the first conductive layer, and
a second through electrode of the through electrodes is electrically coupled to the first conductive layer through another one of the antifuses provided between the second through electrode and the first conductive layer.

15. The method of manufacturing the semiconductor device according to claim 7, wherein the number of the through electrodes is greater than the number of the conductive layers.

16. The method of manufacturing the semiconductor device according to claim 7, wherein the number of the through electrodes is 1.37 times or greater than 1.37 times the number of the conductive layers.

17. A method of manufacturing a semiconductor device comprising:
selecting a first through electrode from a plurality of through electrodes, the through electrodes penetrating a plurality of conductive layers and a plurality of insulating layers that are alternately stacked, wherein
antifuses are each provided between corresponding ones of the through electrodes and corresponding ones of the conductive layers;
applying a first voltage and a second voltage, the first voltage being applied to one or more of the through electrodes excluding the first electrode, and the second voltage being applied to the first through electrode;
selecting a third through electrode from unselected through electrodes of the through electrodes; and
applying the first voltage and a fourth voltage, the first voltage being applied to the first through electrode, and the fourth voltage being applied to the third through electrode.

18. The method of manufacturing the semiconductor device according to claim 17, wherein each one of the through electrodes is electrically coupled to corresponding ones of the conductive layers through corresponding ones of the antifuses provided between the ones of the through electrodes and the corresponding ones of the conductive layers.

19. The method of manufacturing the semiconductor device according to claim 17, wherein
the through electrodes each correspond to any one of the conductive layers,
each of the antifuses provided between the through electrodes and the conductive layers corresponding to each other has a low resistance, and
each of the antifuses provided between the through electrodes and the conductive layers non-corresponding to each other has a high resistance.

20. The method of manufacturing the semiconductor device according to claim 17, wherein
a first through electrode of the through electrodes is electrically coupled to a first conductive layer of the conductive layers through one of the antifuses provided between the first through electrode and the first conductive layer, and
a second through electrode of the through electrodes is electrically coupled to the first conductive layer through another one of the antifuses provided between the second through electrode and the first conductive layer.

* * * * *